(12) United States Patent
Xie et al.

(10) Patent No.: US 12,300,617 B2
(45) Date of Patent: May 13, 2025

(54) SELF-ALIGNED BURIED POWER RAIL CAP FOR SEMICONDUCTOR DEVICES

(71) Applicant: International Business Machines Corporation, Armonk, NY (US)

(72) Inventors: Ruilong Xie, Niskayuna, NY (US); Huimei Zhou, Albany, NY (US); Julien Frougier, Albany, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 18/375,026

(22) Filed: Sep. 29, 2023

(65) Prior Publication Data
US 2024/0030139 A1    Jan. 25, 2024

Related U.S. Application Data

(63) Continuation of application No. 17/466,104, filed on Sep. 3, 2021, now Pat. No. 11,804,436.

(51) Int. Cl.
*H01L 23/535* (2006.01)
*H01L 21/74* (2006.01)
(Continued)

(52) U.S. Cl.
CPC .......... *H01L 23/535* (2013.01); *H01L 21/743* (2013.01); *H01L 23/5226* (2013.01); *H10D 86/201* (2025.01)

(58) Field of Classification Search
CPC ............... H01L 23/535; H01L 23/5226; H01L 23/5286; H01L 21/743; H01L 21/76834;
(Continued)

(56) References Cited

U.S. PATENT DOCUMENTS 6,492,244 B1 * 12/2002 Christensen ...... H01L 21/76243
                                                        438/162
7,002,187 B1    2/2006 Husher
                (Continued)

FOREIGN PATENT DOCUMENTS

EP    3454366 A1    3/2019
EP    3836196 A1    6/2021

OTHER PUBLICATIONS

Anonymous, "Method and Structure for Implementing Replacement/ Buried Power Rail In VTFET", IP.com Electronic Publication Date: Nov. 14, 2019, 6 pages, IP.com No. IPCOM000260354D.
(Continued)

*Primary Examiner* — Britt D Hanley
*Assistant Examiner* — Vicki B. Booker
(74) *Attorney, Agent, or Firm* — Scully, Scott, Murphy & Presser, P.C.; L. Jeffrey Kelly, Esq.

(57) ABSTRACT

A buried power rail is provided in a non-active device region. The buried power rail includes a dielectric liner located on a lower portion of a sidewall and a bottommost surface of the buried power rail. A dielectric cap is located on an upper portion of the sidewall of the buried power rail as well as on a topmost surface of the buried power rail. The dielectric cap is present during the fabrication of a functional gate structure and thus the problems associated with prior art buried power rails are circumvented. The dielectric cap can be removed after the functional gate structure has been formed and a via to buried power rail (VBPR) contact structure can be formed in contact with the buried power rail. In some applications, and after a gate cut process, a gate cut dielectric structure can be formed in contact with the dielectric cap.

19 Claims, 15 Drawing Sheets

(51) Int. Cl.
  *H01L 23/522* (2006.01)
  *H01L 27/12* (2006.01)
  *H10D 86/00* (2025.01)

(58) Field of Classification Search
  CPC ........ H01L 21/76897; H01L 21/76895; H10D 86/201
  See application file for complete search history.

(56) References Cited

U.S. PATENT DOCUMENTS

| | | | |
|---|---|---|---|
| 8,507,957 B2 * | 8/2013 | Hou | H01L 27/11807 257/618 |
| 8,723,269 B2 * | 5/2014 | Rockett | H01L 21/823892 257/369 |
| 9,570,395 B1 | 2/2017 | Sengupta et al. | |
| 10,453,850 B2 | 10/2019 | Smith et al. | |
| 10,586,765 B2 | 3/2020 | Smith et al. | |
| 10,770,479 B2 | 9/2020 | Smith et al. | |
| 10,833,003 B1 | 11/2020 | Chou et al. | |
| 2018/0026042 A1 | 1/2018 | Smith et al. | |
| 2018/0294267 A1 | 10/2018 | Licausi et al. | |
| 2019/0067290 A1 | 2/2019 | Wang et al. | |
| 2019/0080969 A1 | 3/2019 | Tsao | |
| 2019/0386011 A1 | 12/2019 | Weckx et al. | |
| 2020/0134128 A1 | 4/2020 | Peng et al. | |
| 2020/0135578 A1 | 4/2020 | Ching et al. | |
| 2020/0135634 A1 | 4/2020 | Chiang et al. | |
| 2020/0266169 A1 | 8/2020 | Kang et al. | |
| 2020/0279811 A1 | 9/2020 | Hong et al. | |
| 2022/0157957 A1 | 5/2022 | Jin et al. | |

OTHER PUBLICATIONS

Anonymous, "Self-Aligned Buried Contact to Buried Power Rail with WAC", IP.com Electronic Publication Date: Aug. 27, 2019, 8 pages, IP.com No. IPCOM000259609D,.

Gupta, A. et al., "Buried Power Rail Integration With FinFETs for Ultimate CMOS Scaling", IEEE Transactions On Electron Devices, Dec. 2020, pp. 5349-5354, vol. 67, No. 12.

Gupta, A. et al., "Buried Power Rail Integration with Si FinFETs for CMOS Scaling beyond the 5 nm Node", 2020 Symposium on VLSI Technology Digest of Technical Papers, Jun. 2020, 2 pages.

Ryckaert, M. H., "Enabling Sub-5nm CMOS Technology Scaling Thinner and Taller!", 2019 IEEE International Electron Devices Meeting (IEDM), Feb. 2020, pp. 29.4.1-29.4.4.

List of IBM Patents or Patent Applications Treated as Related dated Sep. 29, 2023, 2 pages.

* cited by examiner

SELF-ALIGNED BURIED POWER RAIL CAP FOR SEMICONDUCTOR DEVICES

BACKGROUND

The present application relates to semiconductor technology, and more particularly to a semiconductor device containing a dielectric cap formed on a surface of a buried power rail.

When forming a structure including a plurality of complementary metal oxide semiconductor (CMOS) devices, such as integrated circuits, standard cells may be used as a base unit for designing and manufacturing the integrated circuits. The standard cell(s) may be used to form one or more functional circuits, and each standard cell may have the same footprint (e.g., may have a standard footprint). Using standard cells when designing complex circuits and components reduces design and manufacture costs.

In use, each standard cell of a semiconductor device requires power input (Vdd) and ground (Vss) connections. To power the various components thereof, each standard cell is generally coupled to a power rail which is electrically connected to an active layer of the standard cell to provide the power (Vdd). In some instances, a plurality of power rails may be provided for each standard cell to respectively provide the power (Vdd) and the ground (Vss).

Buried power rails are typically embedded in a shallow trench isolation structure of a semiconductor device. When buried power rails are embedded in the shallow trench isolation structure, the shallow trench isolation structure can be recessed during further device processing which can lead to undesirable physical exposure of the buried power rail. In other cases, the further device processing can lead to breakdown between the functional gate structure and the buried power rails. There is thus a need for providing a semiconductor device containing buried power rails in which the aforementioned problems have been circumvented.

SUMMARY

A buried power rail is provided in a non-active device region of a semiconductor device. The buried power rail includes a dielectric liner located on a lower portion of a sidewall and a bottommost surface of the buried power rail. A self-aligned dielectric cap is located on an upper portion of the sidewall of the buried power rail as well as on a topmost surface of the buried power rail. The dielectric cap is present during the fabrication of a functional gate structure and thus the problems associated with prior art buried power rails are circumvented. The dielectric cap can be removed after the functional gate structure has been formed and a via to buried power rail (VBPR) contact structure can be formed in contact with the buried power rail. In some applications, and after a gate cut process, a gate cut dielectric structure can be formed in contact with the dielectric cap.

One aspect of the present application relates to a semiconductor device. In one embodiment of the present application, the semiconductor device includes a buried power rail located in a non-active device region. The buried power rail of the present application has an upper portion contained in a shallow trench isolation structure and a lower portion contained in a semiconductor substrate. The semiconductor device further includes a dielectric liner located on a lower portion of a sidewall of the buried power rail and on a bottommost surface of the buried power rail, and a dielectric cap is located on an upper portion of the sidewall of the buried power rail and on a topmost surface of the buried power rail.

In another embodiment of the present application, the semiconductor device includes a buried power rail located in a non-active device region. The buried power rail of the present application has an upper portion contained in a shallow trench isolation structure and a lower portion contained in a semiconductor substrate. The semiconductor device further includes a dielectric liner located on a lower portion of a sidewall of the buried power rail and on a bottommost surface of the buried power rail, and a via to buried power rail (VBPR) contact structure contacting an upper portion of the sidewall of the buried power rail and a topmost surface of the buried power rail.

In yet another embodiment of the present application, the semiconductor device includes a buried power rail located in a non-active device region. The buried power rail of the present application has an upper portion contained in a shallow trench isolation structure and a lower portion contained in a semiconductor substrate. The semiconductor device further includes a dielectric liner located on a lower portion of a sidewall of the buried power rail and on a bottommost surface of the buried power rail, a dielectric cap is located on an upper portion of the sidewall of the buried power rail and on a topmost surface of the buried power rail, and a gate cut dielectric structure is located on a topmost surface of the dielectric cap. In accordance with the present application, the gate cut dielectric structure separates a first functional gate structure from a second functional gate structure.

In other aspect of the present application a method of forming a dielectric capped buried power rail is provided. In one embodiment, the method includes forming a buried power rail opening that extends entirely through a shallow trench isolation layer and partially through a semiconductor substrate. Next, a dielectric material layer and a power rail conductive material are formed in the buried power rail opening. The power rail conductive material is then recessed to provide a buried power rail located at a bottom portion of the buried power rail opening. Next, the dielectric material layer is recessed to provide a dielectric material liner that is located on a lower portion of a sidewall of the buried power rail and on a bottommost surface of the buried power rail. A dielectric cap is then formed on an upper portion of the sidewall of the buried power rail and on a topmost surface of the buried power rail.

In some embodiments in which a gate cut process is performed, a gate cut dielectric structure can be formed on a surface of the dielectric cap. In yet other embodiments, the dielectric cap can be removed and a via to buried power rail (VBPR) contact structure can be formed that directly contacts the buried power rail.

DETAILED DESCRIPTION

Figure 1:
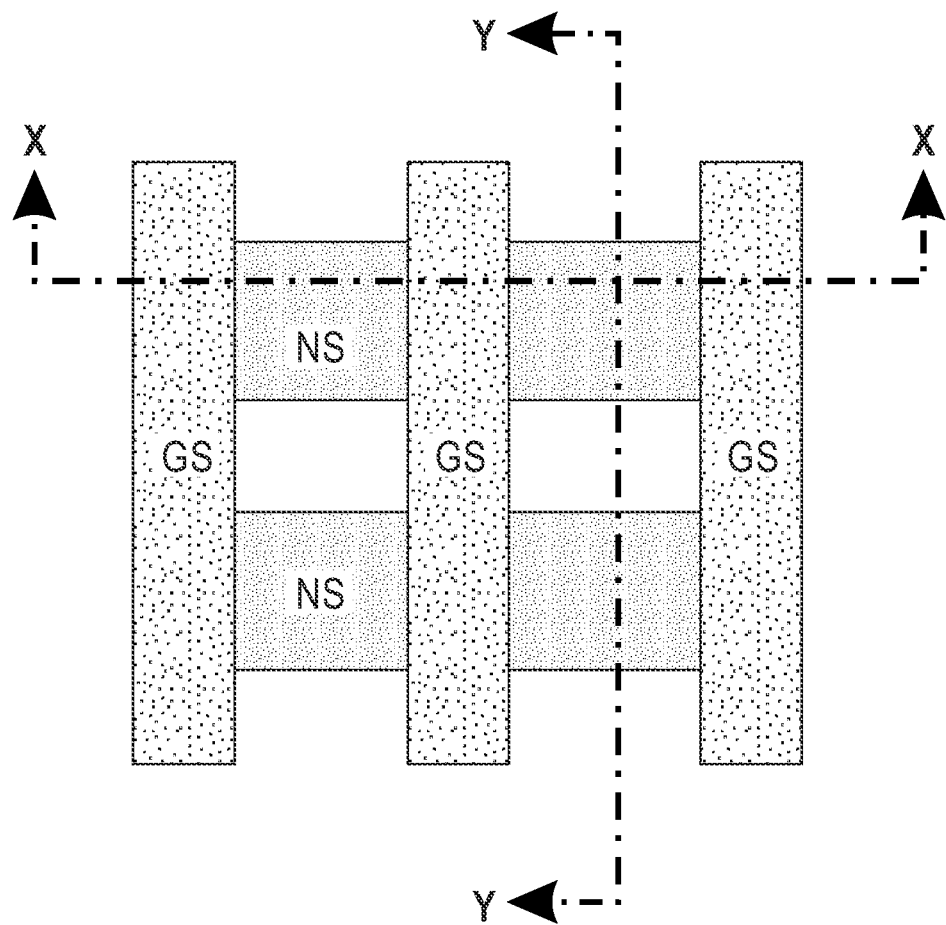
FIG. 1 is a top down view of an exemplary semiconductor device layout that can be employed in accordance with an embodiment of the present application, the semiconductor device layout includes a plurality of vertically stacked semiconductor nanosheets oriented along a first direction, and a plurality of functional gate structures that are oriented in a second direction which is perpendicular to the first direction.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a top down view of an exemplary semiconductor device layout that can be employed in accordance with an embodiment of the present application. The illustrated semiconductor device layout includes a plurality of vertically stacked semiconductor nanosheets, NS, oriented along a first direction, and a plurality of function gate structures, GS, that are oriented in a second direction which is perpendicular to the first direction. FIG. 1 includes a cut X-X which is along one of the vertically stacked semiconductor nanosheets, NS, and a cut Y-Y which is in a region between two adjacent functional gate structures, GS. As is shown in FIG. 1, the vertically stacked semiconductor nanosheets, NS, are oriented parallel to each other, and each functional gate structure, GS, is oriented parallel to each other and perpendicular to the vertically stacked semiconductor nanosheets, NS. In accordance with the present application, the vertically stacked semiconductor nanosheets contain a plurality of spaced apart and suspended semiconductor channel material nanosheets.

It is noted that although the present application describes and illustrates vertically stacked semiconductor nanosheets as active semiconductor channel containing structures, the present application contemplates using other types of active semiconductor channel containing structures (such as, for example, semiconductor fins, semiconductor pillars or semiconductor nanowires) besides vertically stacked semiconductor nanosheets.

It is noted that in the present application, FIGS. 2A, 3A, 4A, 5A, 6A, 7A, 8A, 9A, 10A, 11A, 12A and 13A illustrate the exemplary semiconductor device at cut X-X after different processing steps of the present application, while FIGS. 2B, 3B, 4B, 5B, 6B, 7B, 8B, 9B, 10B, 11B, 12B and 13B illustrate the exemplary semiconductor device at cut Y-Y after different processing steps of the present application.

Figure 2A:
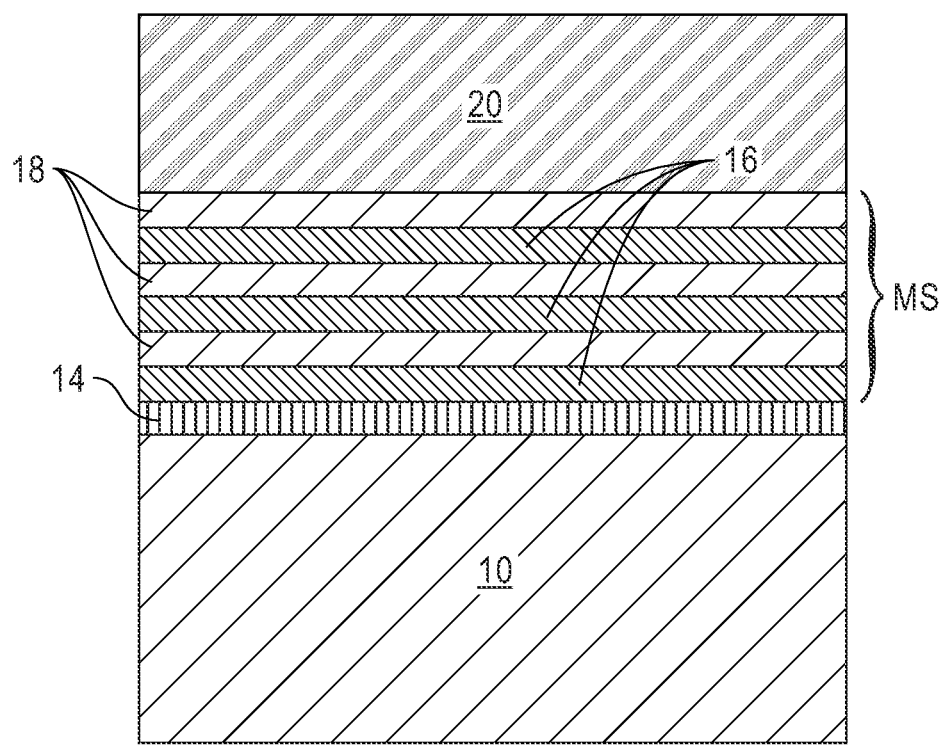
FIG. 2A is a cross sectional view of an exemplary semiconductor device through X-X shown in FIG. 1 that can be employed in accordance with an embodiment of the present application, the exemplary semiconductor device includes a material stack of alternating layers of a sacrificial semiconductor material and a semiconductor channel material located above an active area of a semiconductor substrate, a sacrificial dielectric cap located on the material stack, and a shallow trench isolation layer located laterally adjacent to the active area of the semiconductor substrate, the material stack, and the sacrificial dielectric cap.
Figure 2B:
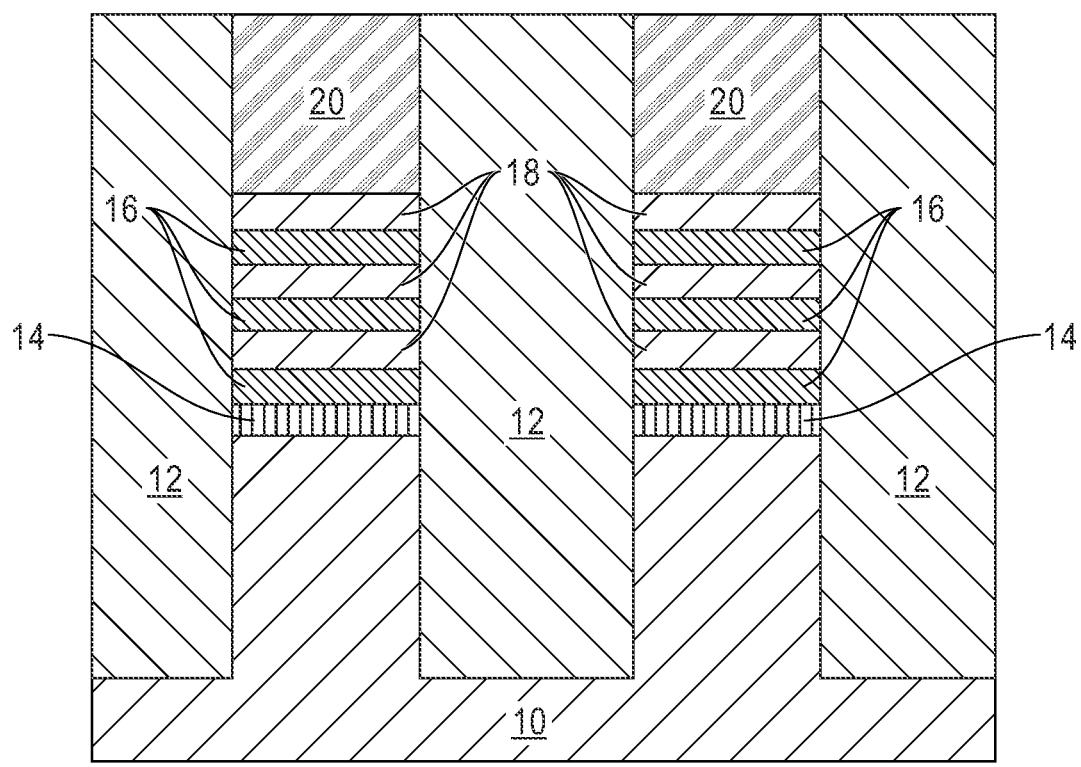
FIG. 2B is a cross sectional view of an exemplary semiconductor device through Y-Y shown in FIG. 1 that can be employed in accordance with an embodiment of the present application, the exemplary semiconductor device includes a material stack of alternating layers of a sacrificial semiconductor material and a semiconductor channel material located above an active area of a semiconductor substrate, a sacrificial dielectric cap located on the material stack, and a shallow trench isolation layer located laterally adjacent to the active area of the semiconductor substrate, the material stack, and the sacrificial dielectric cap.

Referring now to FIGS. 2A and 2B, there are shown an exemplary semiconductor device through X-X of FIG. 1 and Y-Y of FIG. 1, respectively, that can be employed in accordance with an embodiment of the present application. The exemplary semiconductor device illustrated in FIGS. 2A and 2B includes a material stack, MS, of alternating layers of a sacrificial semiconductor material 16 and a semiconductor channel material 18 located above an active device region of a semiconductor substrate 10. As is known to those skilled in the art, the active device region of a substrate, such as semiconductor substrate 10, is an area in which one or more semiconductor devices are formed. The active device region of a substrate, such as semiconductor substrate 10, is located laterally adjacent to a non-active device region. The non-active device region is defined herein by the area in which a shallow trench structure (to be subsequently formed) is present.

The exemplary structure shown in FIGS. 2A and 2B further includes a sacrificial dielectric cap 20 located on the material stack, MS, and a shallow trench isolation layer 12 (which is used to provide the shallow trench isolation structure). The shallow trench isolation layer 12 is located laterally adjacent to the active area of the semiconductor substrate 10, the material stack, MS, and the sacrificial dielectric cap 20. The shallow trench isolation layer 12 extends beneath the topmost surface of the semiconductor substrate 10 and has a topmost surface which can be coplanar with a topmost surface of the sacrificial dielectric cap 20. In some embodiments, the exemplary structure shown in FIGS. 2A-2B can further include an optional placeholder material layer 14. As is shown, and when present, the optional placeholder material layer 14 is located between the material stack, MS, and the semiconductor substrate 10.

In one embodiment, the exemplary structure shown in FIGS. 2A-2B can be formed by first providing the semiconductor substrate 10. Next, the optional placeholder material layer 14, the material stack, MS, including alternating layers of sacrificial semiconductor material 16 and semiconductor channel material 18, and the sacrificial dielectric cap 20 are formed by first epitaxially growing a layer of the optional placeholder material, followed by growing alternating blanket layers of sacrificial semiconductor material 16 and semiconductor channel material 18, and thereafter depositing a blanket layer of a sacrificial dielectric material. In one example, the blanket layer of the optional placeholder material layer, alternating blanket layers of sacrificial semiconductor material 16 and semiconductor channel material 18 can be deposited utilizing epitaxial growth. The blanket layer of the optional placeholder material, alternating blanket layers of sacrificial semiconductor material 16 and semiconductor channel material 18, and the blanket layer of a sacrificial dielectric material are then patterned by lithography and etching through each of the blanket layers and a top portion of the semiconductor substrate to provide the optional placeholder material layer 14, the material stack, MS, including alternating layers of sacrificial semiconductor material 16 and semiconductor channel material 18, and the sacrificial dielectric cap 20. The shallow trench isolation layer 12 can then be formed by filling the recessed region and are area laterally adjacent to the material stack, MS, with one of the trench dielectric materials such as $SiO_2$, or a thin SiN liner followed by $SiO_2$. A planarization process (such as, for example, chemical mechanical polishing (CMP)) and/or densification process can be performed after the trench fill process.

It is noted that the number of material stacks, MS, and alternating layers of sacrificial semiconductor material 16 and semiconductor channel material 18 within the material stack, MS, can vary and is not limited to the number illustrated in the drawings of the present application.

The semiconductor substrate 10 can be composed of one or more semiconductor materials. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, the entirety of the semiconductor substrate 10 is composed of one or more semiconductor materials. In such an embodiment, semiconductor substrate 10 can be referred to a bulk semiconductor substrate.

In another embodiment of the present application, semiconductor substrate 10 can be composed of a multilayered stack of from bottom to top, a bottom semiconductor material layer, an insulator material layer, and a top semiconductor material layer. Such a semiconductor substrate 10 can be referred to as a semiconductor-on-insulator (all) substrate. In such an embodiment, the top and bottom semiconductor material layers can be composed of one of the semiconductor materials mentioned above, and the insulator material layer can be composed of a dielectric material such as, for example, silicon oxide, and/or boron nitride. An SOI substrate can be made utilizing processing techniques well known to those skilled in the art. For example, a SOI substrate can be formed by a process referred to as a SIMOX (separation by ion implantation of oxygen) in which oxygen ions are implanted into a bulk semiconductor material and then an anneal is performed to convert the implanted oxygen region into an oxide layer. Alternatively, the SOI substrate can be formed by a bonding process in which an oxide (an/or boron nitride) layer that is formed on a semiconductor material layer is bonded to a base semiconductor material layer.

The shallow trench isolation layer 12 can be composed of a trench dielectric material such as, for example, silicon dioxide, silicon nitride, silicon oxynitride, or any suitable combination of those dielectric materials. As shown in FIGS. 2A-2B, the shallow trench isolation layer 12 typically has a topmost surface that is coplanar with a topmost surface of the sacrificial dielectric cap 20.

In one embodiment, the optional placeholder material layer 14 can be composed of a semiconductor material that is compositionally different from the upper semiconductor material portion of the semiconductor substrate 10, as well as the alternating layers of sacrificial semiconductor material 16 and semiconductor channel material 18 that are present in the material stack, MS. In one example, and when the upper semiconductor material portion of the substrate 10 and the layers of semiconductor channel material 18 are composed of silicon, and the layers of sacrificial semiconductor material 16 is composed of silicon germanium alloy having a first germanium content (such as, for example, 30 atomic percent germanium), the optional placeholder material layer 14 can be composed of a silicon germanium alloy having a second germanium content (such as, for example, 60 atomic percent germanium) that differs from the first germanium content.

As mentioned above, the material stack, MS, includes alternating layers of sacrificial semiconductor material 16 and semiconductor channel material 18. Each layer of sacrificial semiconductor material 16 within the material stack, MS, can be referred to as a "sacrificial semiconductor material layer", and each layer of semiconductor channel material 18 within the material stack, MS, can be referred to as a "semiconductor channel material layer". As is shown in the illustrated embodiment, the material stack, MS, includes an equal number of sacrificial semiconductor material layers 16 and semiconductor channel material layers 18. By way of one example, the illustrated material stack, MS, includes three layers of sacrificial semiconductor material 16, and three layers of semiconductor channel material 18.

Each layer of sacrificial semiconductor material 16 is composed of a first semiconductor material, while each layer of semiconductor channel material 18 is composed of a second semiconductor material that is compositionally different from the first semiconductor material. In some embodiments, the second semiconductor material that provides each layer of semiconductor channel material 18 is a semiconductor material that is capable of providing high channel mobility for n-type FET devices. In other embodiments, the second semiconductor material that provides each layer of semiconductor channel material 18 is a semiconductor material that is capable of providing high channel mobility for p-type FET devices.

The first semiconductor material that provides each layer of sacrificial semiconductor material 16 and the second semiconductor material that provides each layer of semiconductor channel material 18 can include one of the semiconductor materials mentioned above for semiconductor substrate 10. In the present application, the first semiconductor material that provides each layer of sacrificial semiconductor material 16 can be compositionally the same as, or compositionally different from, at least an uppermost semiconductor material portion of the semiconductor substrate 10; when an optional placeholder material layer 14 is present, the first semiconductor material that provides each layer of sacrificial semiconductor material 16 is compositionally different from the optional placeholder material layer 14. Typically, the first semiconductor material that provides each layer of sacrificial semiconductor material 16 is compositionally different from at least the uppermost semiconductor material portion of the semiconductor substrate 10. The second semiconductor material that provides each layer of semiconductor channel material 18 can be compositionally the same as, or compositionally different from, at least an uppermost semiconductor material portion of the semiconductor substrate 10; when an optional placeholder material layer 14 is present, the second semiconductor material that provides each layer of semiconductor channel material 18 is compositionally different from the optional placeholder material layer 14. Typically, the second semiconductor material that provides each layer of semiconductor channel material 18 is compositionally the same as at least the uppermost semiconductor material portion of the semiconductor substrate 10. In one example, the semiconductor substrate 10 is composed silicon, the first semiconductor material that provides each layer of sacrificial semiconductor material 16 is composed of a silicon germanium alloy, and the second semiconductor material that provides each layer of semiconductor channel material 18 is composed of silicon. Other combinations of semiconductor materials are possible as long as the first semiconductor material that provides each layer of sacrificial semiconductor material 16 is compositionally different from the second semiconductor material that provides each layer of semiconductor channel material 18.

At this point of the present application, each layer of sacrificial semiconductor material 16 has a width that is the same as a width of each layer of semiconductor channel material 18. As such, and at this point of the present application, the sidewalls of each layer of sacrificial semiconductor material 16 are vertically aligned with the sidewalls of each layer of semiconductor channel material 18; when an optional placeholder material layer 14 is present, the sidewalls of each layer of sacrificial semiconductor material 16 and each layer of semiconductor channel material 18 are vertically aligned to sidewalls of the optional placeholder material layer 14 (thus, and when present, the optional placeholder material layer 14 has a same width as each layer of sacrificial semiconductor material 16 and each layer of semiconductor channel material 18). A typical width for each layer of sacrificial semiconductor material 16, each layer of semiconductor channel material 18, and if present the optional placeholder material layer 14 is from 10 nm to 100 nm. Other widths are contemplated and can be used as the widths of each layer of sacrificial semiconductor material 16, each layer of semiconductor channel material 18, and, if present, the optional placeholder material layer 14.

The thickness (i.e., height) of each layer of sacrificial semiconductor material 16 can be the same or different from the thickness of each layer of semiconductor channel material 18. A typical thickness for each layer of sacrificial semiconductor material 16, and each layer of semiconductor channel material 18 is from 4 nm to 20 nm. Other thicknesses are contemplated and can be used as the thickness of each layer of sacrificial semiconductor material 16 and each layer of semiconductor channel material 18. The thickness of the optional placeholder material layer 14 can be within the range mentioned above for the thickness of the layers of sacrificial semiconductor material 16 and layers of the semiconductor channel material 18.

The sacrificial dielectric cap 20 is composed of a hard mask material such as, for example, silicon dioxide, silicon nitride, silicon oxynitride, or any suitable combination of those dielectric materials. The sacrificial dielectric cap 20 can be compositionally the same as, or compositionally different from the shallow trench isolation layer 12. The sacrificial dielectric cap 20 can have a thickness from 10 nm to 100 nm; although other thicknesses for the sacrificial dielectric cap 20 are contemplated and can be used in the present application as the thickness of the sacrificial dielectric cap 20.

Figure 3A:
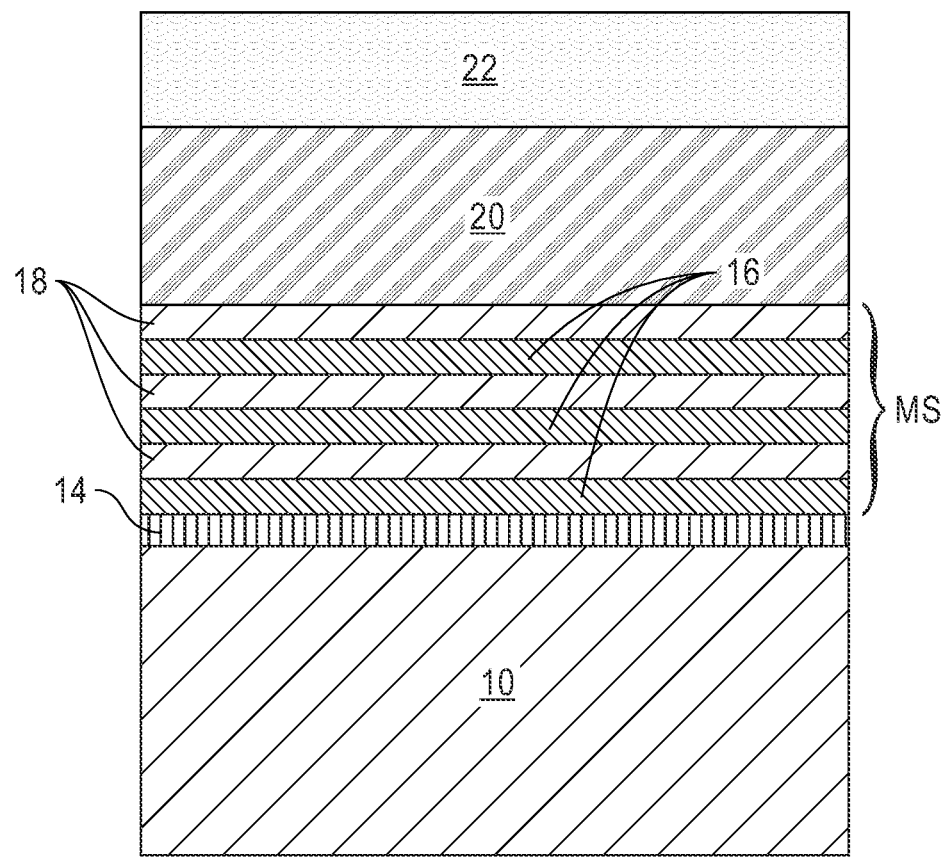
FIG. 3A is a cross sectional view of the exemplary semiconductor device of FIG. 2A after forming a buried power rail opening that extends entirely through the shallow trench isolation layer and partially through the semiconductor substrate.
Figure 3B:
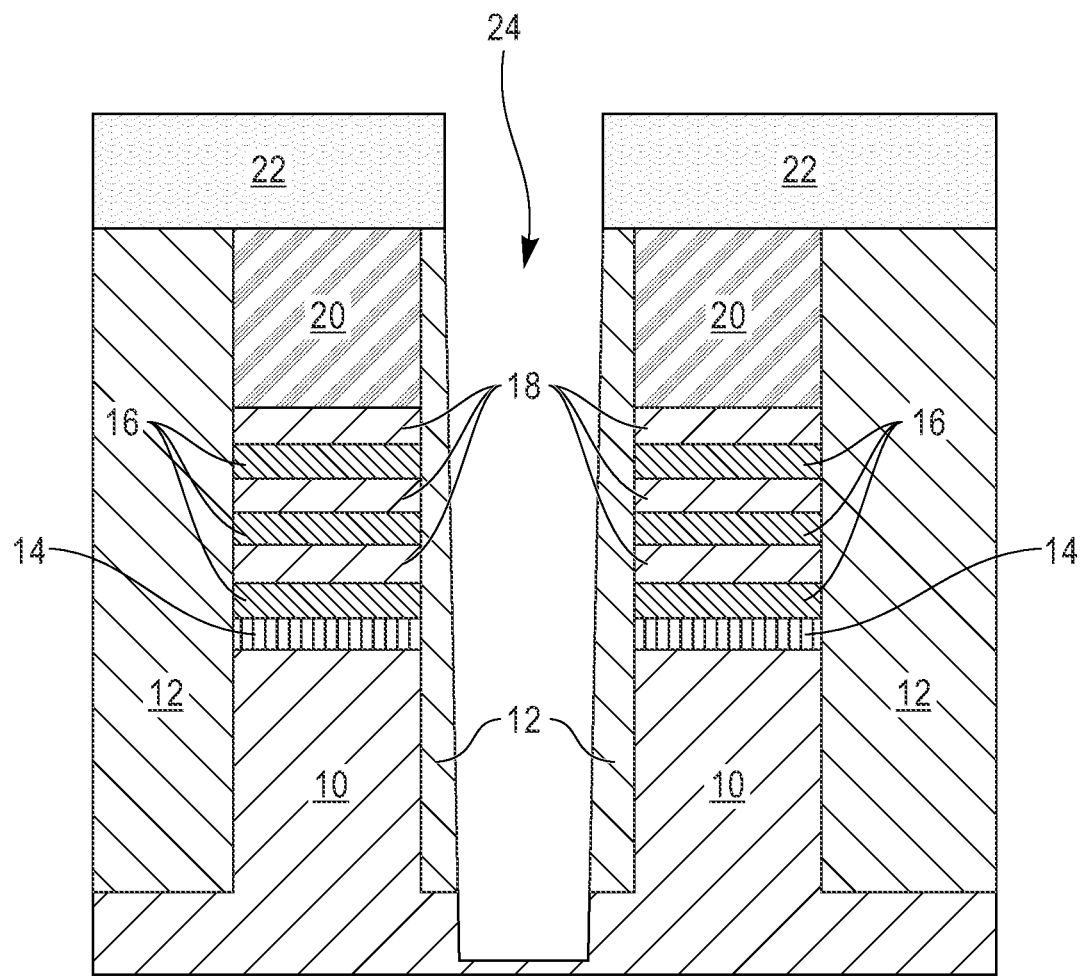
FIG. 3B is a cross sectional view of the exemplary semiconductor device of FIG. 2B after forming a buried power rail opening that extends entirely through the shallow trench isolation layer and partially through the semiconductor substrate.

Referring now to FIGS. 3A and 3B, there are shown the exemplary semiconductor device of FIGS. 2A and 2B, respectively, after forming a buried power rail opening 24 that extends entirely through the shallow trench isolation layer 12 and partially through the semiconductor substrate 10. Although a single buried power rail opening 24 is shown in FIGS. 3A and 3B, a plurality of buried power rail openings 24 can be formed. The buried power rail opening 24 can be formed by lithography and etching. The lithography step includes forming a patterned mask 22 to define the opening region for buried power rail, while protecting other regions from being etched. The patterned mask 22 can be composed of any mask material such as, for example, an organic planarization layer (OPL).

In some embodiments and as is shown in FIGS. 3A and 3B, the buried power rail opening 24 has tapered sidewalls. In other embodiments (not shown), the buried power rail opening 24 has vertical sidewalls. In either embodiment, the bottommost wall of the buried power rail opening 24 physically exposes a sub-surface of the semiconductor substrate 10. By "sub-surface" it is meant a surface of a material that is located between a topmost surface and a bottommost surface of the material.

As is shown, in FIGS. 3A and 3B, a portion of the shallow trench isolation material layer 12 remains along an upper sidewall portion of the buried power rail opening 24, while the lower sidewall portion of the buried power rail opening 24 physically exposes a portion (semiconductor and/or dielectric) of the semiconductor substrate 10.

The patterned mask 22 can be removed from the structure after forming the buried power rail opening 24 utilizing any material removal process such as, for example, ashing.

Figure 4A:
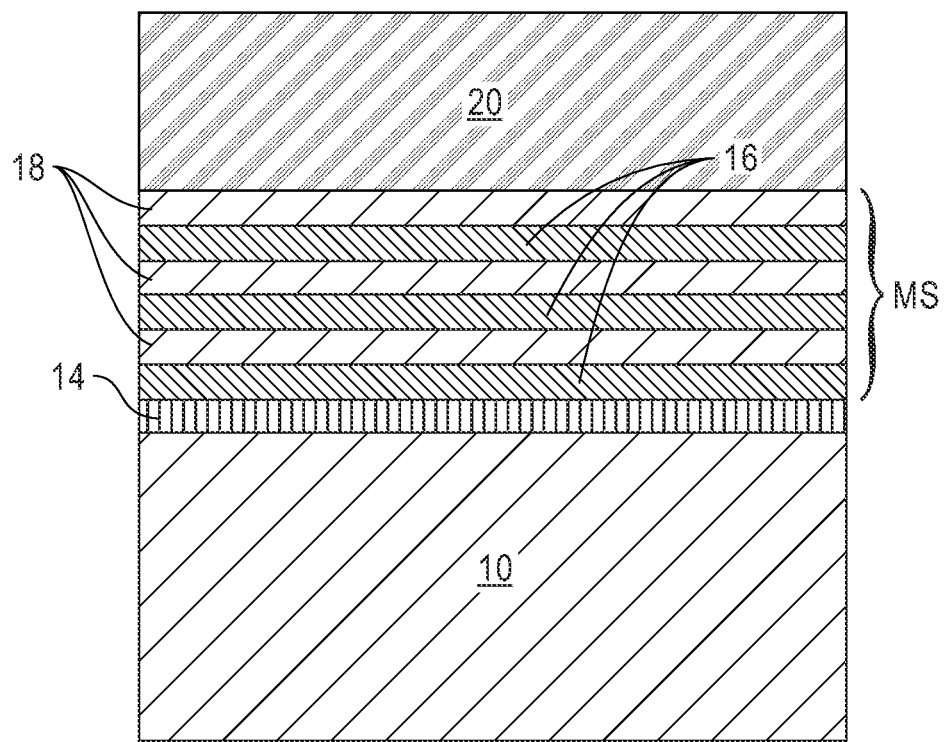
FIG. 4A is a cross sectional view of the exemplary semiconductor device of FIG. 3A after forming a dielectric material layer and a power rail conductive material in the buried power rail opening.
Figure 4B:
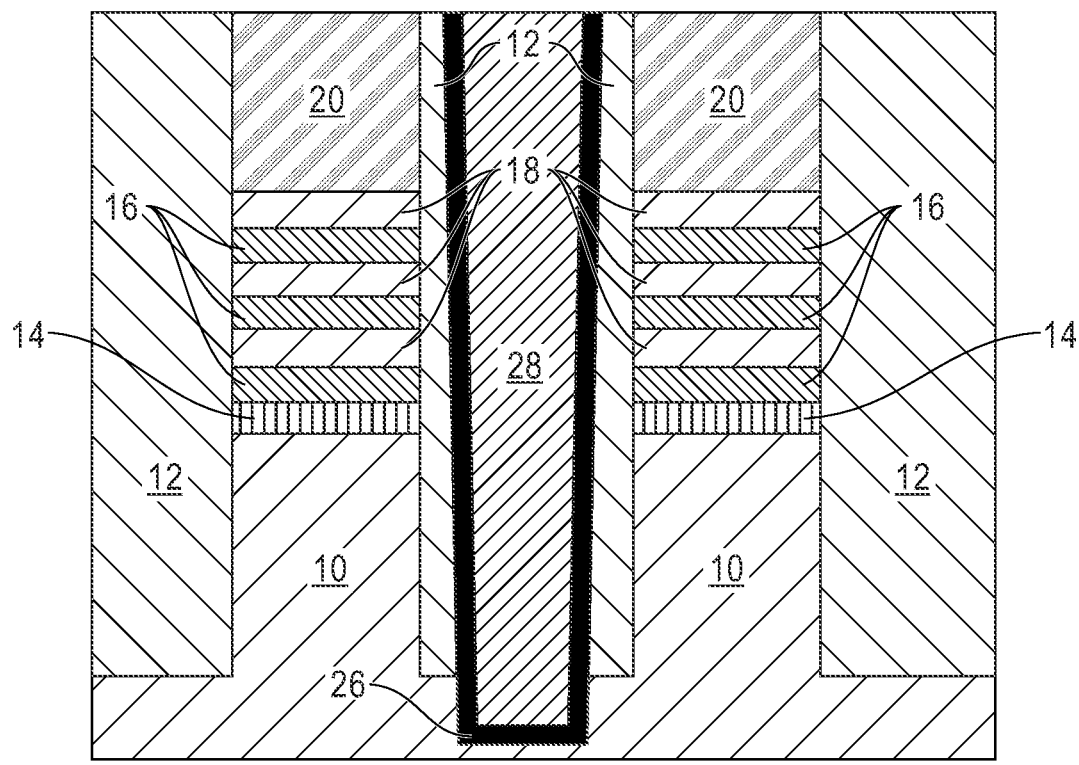
FIG. 4B is a cross sectional view of the exemplary semiconductor device of FIG. 3B after forming a dielectric material layer and a power rail conductive material in the buried power rail opening.

Referring now to FIGS. 4A and 4B, there are shown the exemplary semiconductor device of FIGS. 3A and 3B, respectively, after forming a dielectric material layer 26 and a power rail conductive material 28 in the buried power rail opening 24. Other buried power rail openings 24 can be processed to include the dielectric material layer 26 and the power rail conductive material 28. As is illustrated in FIGS. 4A and 4B, the dielectric material layer 26 is located along the entire sidewall and bottommost surface of the power rail conductive material 28. As is further illustrated, the dielectric material layer 26 has a topmost surface that is coplanar with a topmost surface of each of the power rail conductive material 28, the shallow trench dielectric layer 12, and the sacrificial dielectric cap 20.

The dielectric material layer 26 is composed of a dielectric material that is compositionally different from the dielectric material that provides the shallow trench isolation layer 12 and the sacrificial dielectric cap 20. In one embodiment, the dielectric material that provides the dielectric material layer 26 is composed of a silicon nitride based dielectric material such as, for example, silicon nitride, silicon boron carbon nitride, or a dielectric including atoms of Si, O, C and N. In another embodiment, the dielectric material that provides the dielectric material layer 26 is composed of a silicon carbon based dielectric material such as, for example, silicon carbide or a dielectric including atoms of Si, C and O. Other dielectric materials besides a silicon nitride based dielectric and a silicon carbon based dielectric material can be used as the dielectric material that provides the dielectric material layer 26. The dielectric material layer 26 does not fill the entirety of the volume of the buried power opening 24. The dielectric material layer 26 can have a thickness from 2 nm to 15 nm; although other thicknesses for the dielectric material layer 26 are contemplated and can be used as the thickness of the dielectric material layer 26 in the present application. In some embodiments, the dielectric material layer 26 is conformal layer. By "conformal layer" it is meant that a material layer has a thickness along horizontal surfaces that is the same as a thickness of the same material layer along vertical surfaces.

The power rail conductive material 28 is composed of any electrically conductive power rail material including, but not limited to, tungsten (W), cobalt (Co), aluminum (Al), copper (Cu), platinum (Pt), rhodium (Rh), or palladium (Pd), with a thin metal adhesion layer (such as TiN, TaN) typically being formed prior to the conductive metal deposition; for clarity, the metal adhesion layer is not separated illustrated in the drawings of the present application The power rail conductive material 28 is formed on the dielectric material layer 26 and fills in the remaining the volume of the buried power opening 24.

The dielectric material layer 26 is first formed by depositing a blanket layer of dielectric material inside and outside (including on top of the sacrificial dielectric cap 20) of the buried power rail opening 24. Exemplary deposition processes that can be used to form the blanket layer of dielectric material that provides the dielectric material layer 26 includes, but are not limited to, atomic layer deposition (ALD), chemical vapor deposition (CVD), plasma enhanced chemical vapor deposition (PECVD), physical vapor deposition (PVD), evaporation or spin-on coating. Next, a blanket layer of electrically conductive power rail material can be deposited on the blanket layer of dielectric material that is present inside and outside (including on top of the sacrificial dielectric cap 20) of the buried power rail opening 24. Exemplary deposition processes that can be used to form the blanket layer of electrically conductive power rail material that provides the power rail conductive material 28 include, but are not limited to, CVD, PECVD, PVD, sputtering or platting.

After depositing the blanket layer of dielectric material and the blanket layer of electrically conductive power rail material, a planarization process such as, for example, (CMP), can be used to remove the blanket layer of dielectric material and the blanket layer of electrically conductive power rail material that are present outside of the buried power rail opening 24 and a top of the sacrificial dielectric cap 20. A portion of the blanket layer of dielectric material and a portion of the blanket layer of electrically conductive power rail material remain in the buried power rail opening 24. The portion of the blanket layer of dielectric material that remains in the buried power rail opening 24 can be referred as the dielectric material layer 26, while the portion of the blanket layer of electrically conductive power rail material that remains in the buried power rail opening 24 can be referred as the power rail conductive material 28.

Figure 5A:
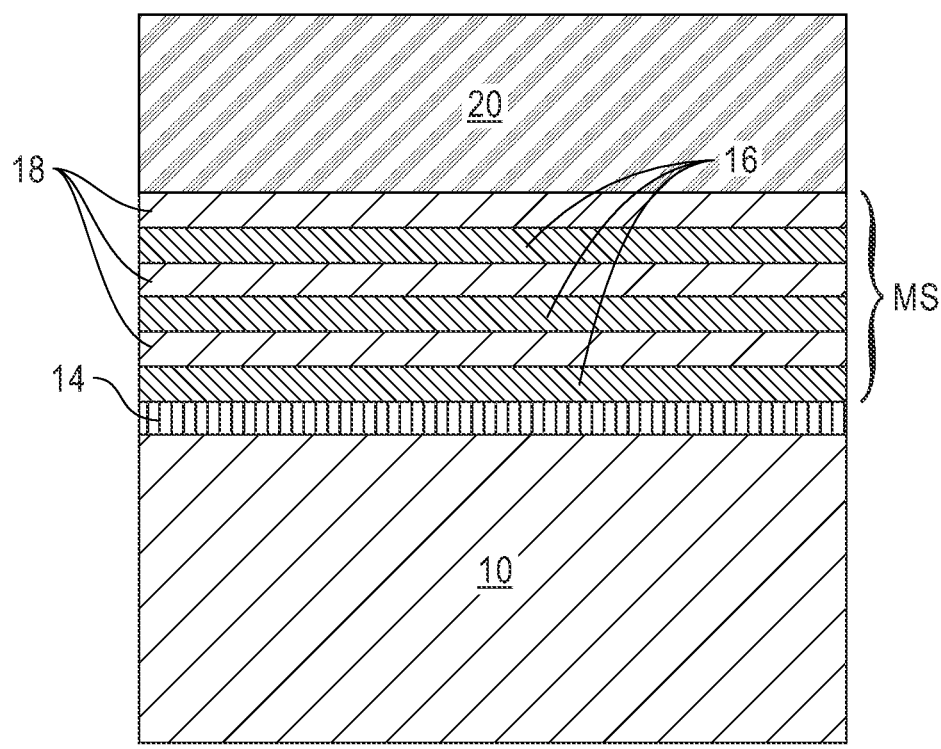
FIG. 5A is a cross sectional view of the exemplary semiconductor device of FIG. 4A after recessing the power rail conductive material to provide a buried power rail located at a bottom portion of the buried power rail opening.
Figure 5B:
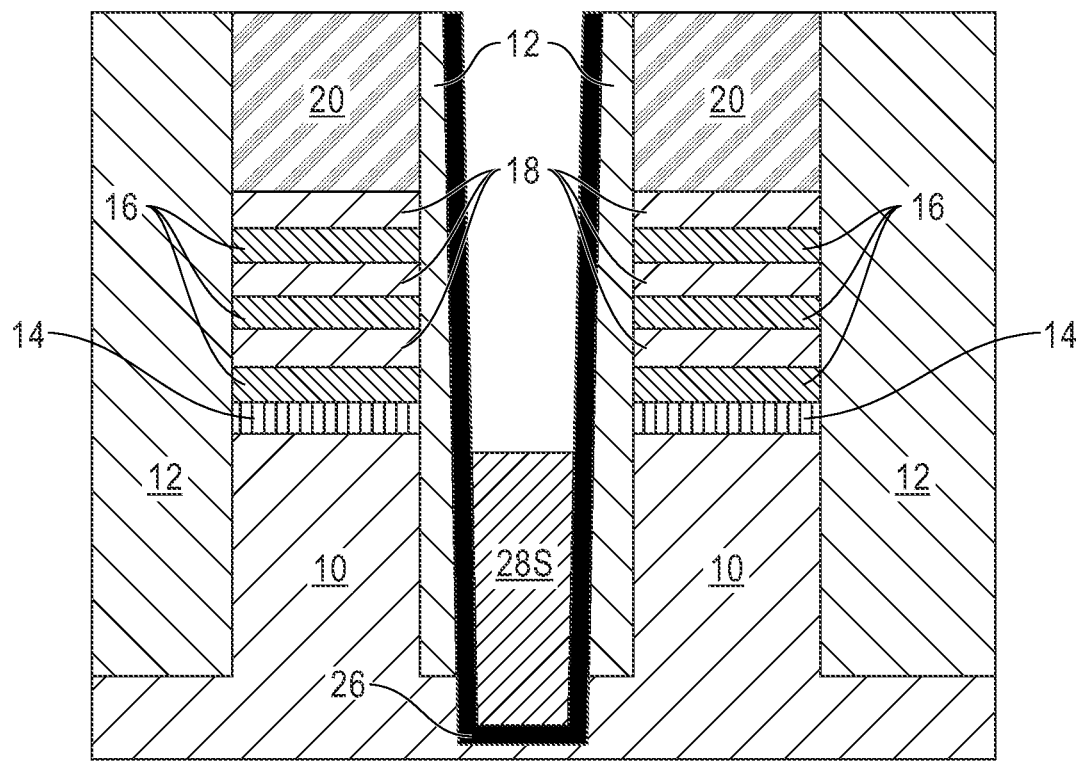
FIG. 5B is a cross sectional view of the exemplary semiconductor device of FIG. 4B after recessing the power rail conductive material to provide a buried power rail located at a bottom portion of the buried power rail opening.

Referring now to FIGS. 5A and 5B, there are shown the exemplary semiconductor device of FIGS. 4A and 4B, respectively, after recessing the power rail conductive material 28 to provide a buried power rail 28S located at a bottom portion of the buried power rail opening 24. The recessing of the power rail conductive material 28 can be performed utilizing an etch that is selective in removing the electrically conductive power rail material that provides the buried power rail conductive material 28; no recessing of the dielectric material layer 26 occurs during this recessing step of the present application. The recessing of the power rail conductive material 28 is not too deep and thereby permitting easier access to the buried power rail 28S. In one embodiment and as is shown, the power rail conductive material 28 is recessed to a depth such that the resultant buried power rail 28S has a topmost surface that is located beneath a topmost surface of the semiconductor substrate 10.

As is shown, the buried power rail 28S has an upper portion that is contained in the shallow trench isolation layer 12 and a lower portion that is contained in the semiconductor substrate 10.

Figure 6A:
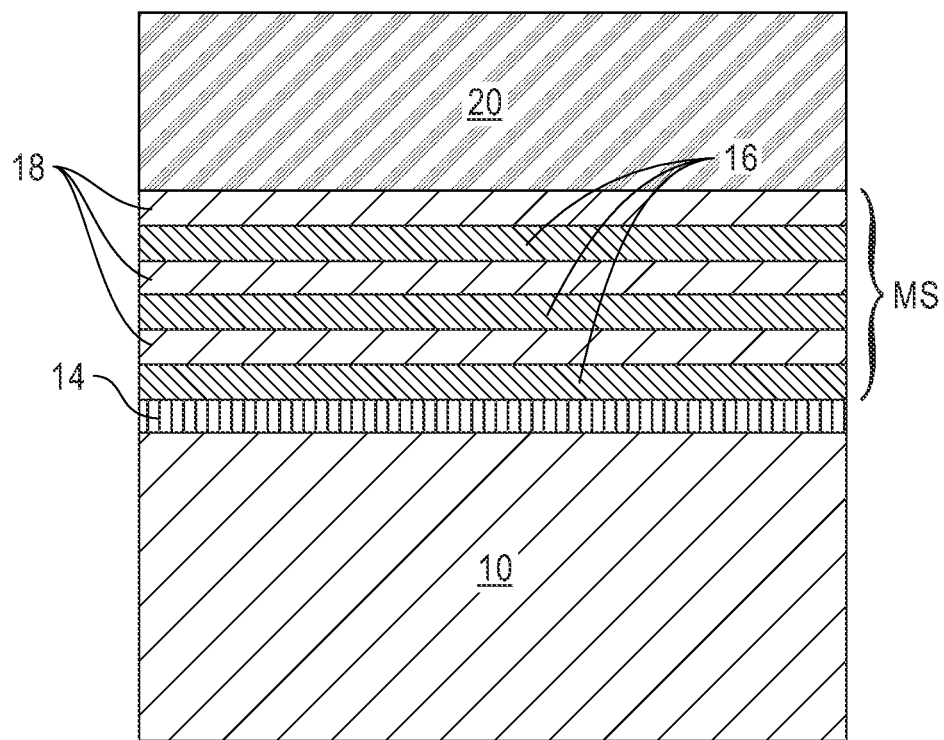
FIG. 6A is a cross sectional view of the exemplary semiconductor device of FIG. 5A after recessing the dielectric material layer to provide a dielectric material liner that is located on a lower portion of a sidewall of the buried power rail and on a bottommost surface of the buried power rail.
Figure 6B:
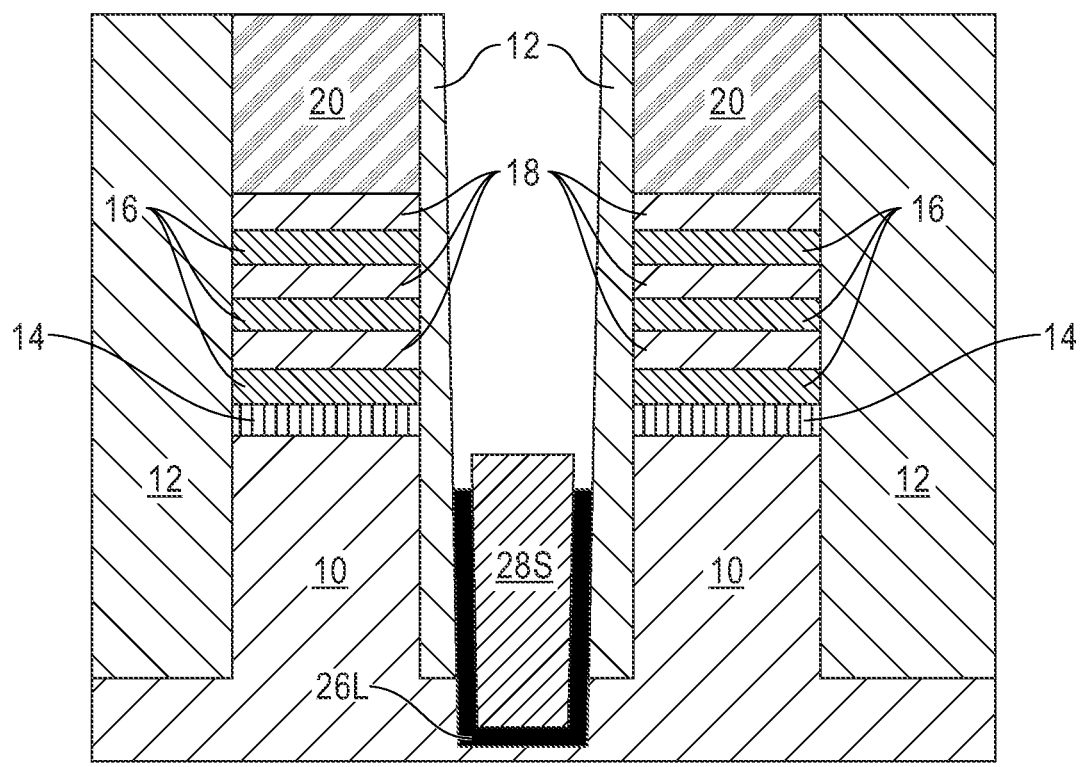
FIG. 6B is a cross sectional view of the exemplary semiconductor device of FIG. 5B after recessing the dielectric material layer to provide a dielectric material liner that is located on a lower portion of a sidewall of the buried power rail and on a bottommost surface of the buried power rail.

Referring now to FIGS. 6A and 6B, there are shown the exemplary semiconductor device of FIGS. 5A and 5B, respectively, after recessing the dielectric material layer 26 to provide a dielectric material liner 26L that is located on a lower portion of a sidewall of the buried power rail 28S and on a bottommost surface of the buried power rail 28S; the upper portion of the sidewall of the buried power rail 28S is physically exposed after this recessing step of the present application.

The recessing of the dielectric material layer 26 can be performed utilizing an etching process that is selective in removing the dielectric material that provides the dielectric material layer 26; no recessing of the buried power rail 28S, shallow trench isolation layer 12 or sacrificial dielectric cap 20 occurs during this recessing step of the present application. The etch used to recess the dielectric material layer 26 is designed to have an over etch so as to remove the dielectric material layer 26 from the upper portion of the sidewall of the buried power rail 28S.

Figure 7A:
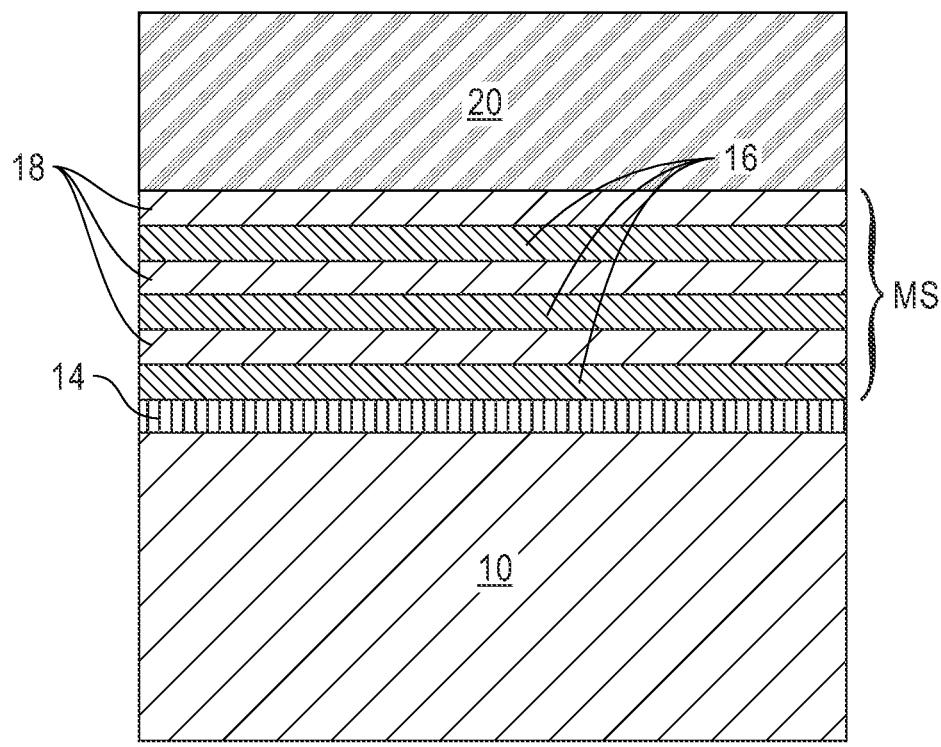
FIG. 7A is a cross sectional view of the exemplary semiconductor device of FIG. 6A after forming a dielectric cap on an upper portion of the sidewall of the buried power rail and on a topmost surface of the buried power rail.
Figure 7B:
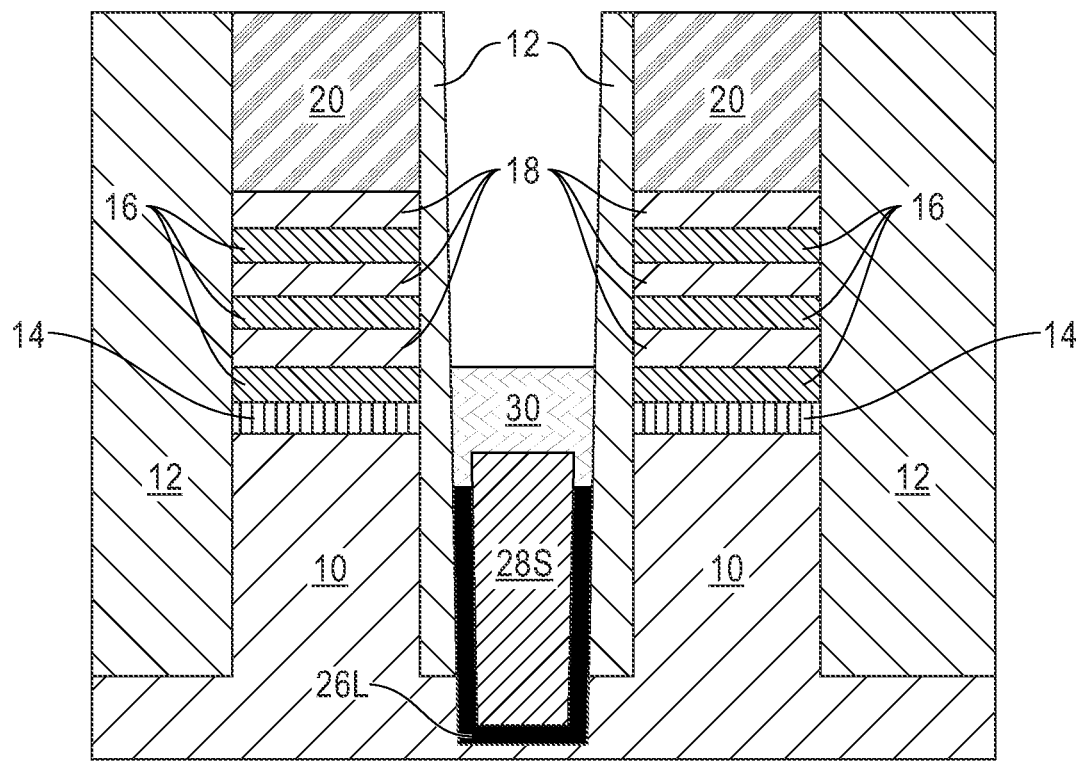
FIG. 7B is a cross sectional view of the exemplary semiconductor device of FIG. 6B after forming a dielectric cap on an upper portion of the sidewall of the buried power rail and on a topmost surface of the buried power rail.

Referring now to FIGS. 7A and 7B, there are shown the exemplary semiconductor device of FIGS. 6A and 6B, respectively, after forming a dielectric cap 30 on an upper portion of the sidewall of the buried power rail 28S and on a topmost surface of the buried power rail 28S. The dielectric cap 30 also contacts a topmost surface of the dielectric material liner 26L. The dielectric cap 30 typically has a topmost surface that is located above a topmost surface of the semiconductor substrate 10. Dielectric cap 30 can be referred to herein as a self-aligned buried power rail cap.

The dielectric cap 30 is composed of dielectric material that is compositionally different from the dielectric material that provides the dielectric material layer 26 (and thus dielectric material liner 26L), the shallow trench isolation layer 12, and the sacrificial dielectric cap 20. In one embodiment, the dielectric material that provides the dielectric cap 30 is composed of a silicon nitride based dielectric material such as, for example, silicon nitride, silicon boron carbon nitride, or a dielectric including atoms of Si, O, C and N. In another embodiment, the dielectric material that provides the dielectric cap 30 is composed of a silicon carbon based dielectric material such as, for example, silicon carbide or a dielectric including atoms of Si, C and O. Other dielectric materials besides a silicon nitride based dielectric and a silicon carbon based dielectric material can be used as the dielectric material that provides the dielectric cap 30. In one example, and when the dielectric material layer 26 is composed of a silicon nitride based dielectric material, the dielectric cap 30 is composed of a silicon carbon base dielectric material.

The dielectric cap 30 can be formed by first depositing a dielectric material, and thereafter recessing the deposited dielectric material. The depositing of the dielectric material that provides the dielectric cap 30 can include CVD, PECVD, or PVD, and the recessing of the deposited dielectric material that provides the dielectric cap 30 can include an etch that is selective in removing the dielectric material that provides the dielectric cap 30.

The dielectric cap 30 protects the dielectric material liner 26L during a subsequently performed process step that includes removal of the sacrificial dielectric cap 20. The dielectric cap 30 also protects the buried power rail 28S during subsequently performed processing steps that include forming the source/drain regions and forming the functional gate structure. The dielectric cap 30 also provides an easily accessible landing pad for a subsequently formed gate gut structure. Other benefits of the dielectric cap 30 include a reduced shared gate capacitance and/or easier access to the buried power rail 28S during subsequently performed process steps that provide the via to buried power rail (VBPR) contact structure.

Figure 8A:
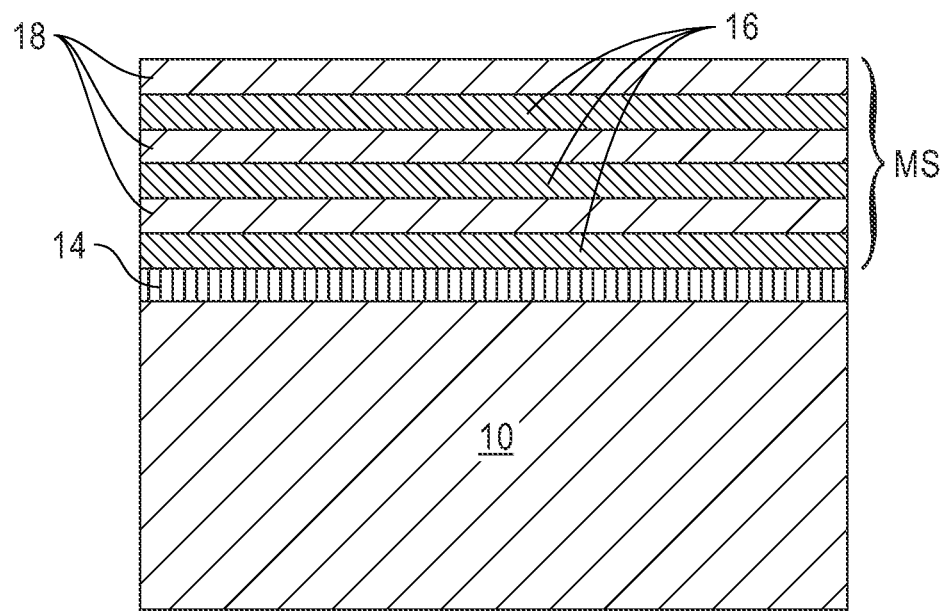
FIG. 8A is a cross sectional view of the exemplary semiconductor device of FIG. 7A after removing (i.e., recessing) the shallow trench isolation layer that is laterally adjacent the material stack, and the sacrificial dielectric cap, while maintaining the shallow trench isolation layer that is located laterally adjacent to the active area of the semiconductor substrate, and removing the sacrificial dielectric cap.
Figure 8B:
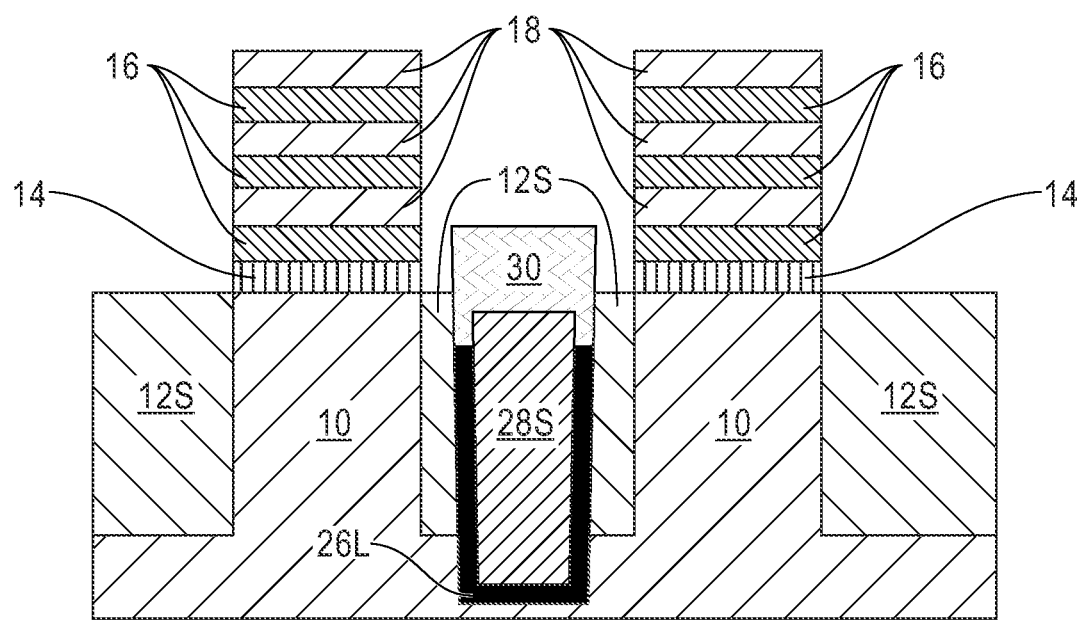
FIG. 8B is a cross sectional view of the exemplary semiconductor device of FIG. 7B after removing (i.e., recessing) the shallow trench isolation layer that is laterally adjacent the material stack, and the sacrificial dielectric cap, while maintaining the shallow trench isolation layer that is located laterally adjacent to the active area of the semiconductor substrate, and removing the sacrificial dielectric cap.

Referring now to FIGS. 8A and 8B, there are shown the exemplary semiconductor device of FIGS. 7A and 7B, respectively, after removing (i.e., recessing) the shallow trench isolation layer 12 that is laterally adjacent to the material stack, MS, and the sacrificial dielectric cap 20, while maintaining the shallow trench isolation layer 12 that is located laterally adjacent to the active area of the semiconductor substrate 10 and removing the sacrificial dielectric cap 20.

The removal (i.e., recessing) of the shallow trench isolation layer 12 is performed utilizing an etching process that is selective in removing the dielectric material that provides the shallow trench isolation layer 12. In embodiments in which the shallow trench isolation layer 12 and the sacrificial dielectric cap 20 are both composed of a compositionally same dielectric material, the sacrificial dielectric cap 20 can be removed during the removal (i.e., recessing) of the shallow trench isolation layer 12. In other embodiments, the sacrificial dielectric cap 20 can be removed utilizing a different material removal process than that used to remove (i.e., recess) the shallow trench isolation layer 12. In either instance, the topmost surface of the material stack, MS, is physically exposed after removal of the sacrificial dielectric cap 20 from the exemplary structure.

The maintained shallow trench isolation layer 12 can be referred to as a shallow trench isolation structure 12S. In some embodiments, the shallow trench isolation structure 12S can have a topmost surface that is coplanar with a topmost surface of the semiconductor substrate 10. In other embodiments, the shallow trench isolation structure 12S has a topmost surface that is located above or below the topmost surface of the semiconductor substrate 10. In any of the embodiments mentioned above, the topmost surface of the shallow trench isolation structure 12S is recessed as compared to the topmost surface of the dielectric cap 30. It is noted that the dielectric cap 30 can have a topmost surface that is higher than a topmost surface of the semiconductor substrate 10, or the dielectric cap 30 can have a topmost surface that is higher than a topmost surface of the shallow trench isolation structure 12.

As is shown in FIG. 8B, the buried power rail 28S is located in a non-active device region, wherein the buried power rail 28S has an upper portion contained in the shallow trench isolation structure 12S and a lower portion contained in the semiconductor substrate 10. FIG. 8B further illustrates that the dielectric liner 26L is located on a lower portion of a sidewall of the buried power rail 28S and on a bottommost surface of the buried power rail 28S, and that dielectric cap 30 is located on an upper portion of the sidewall of the buried power rail 28S and on a topmost surface of the buried power rail 28S. The dielectric cap 30 also contracts sidewalls of the shallow trench isolation structure 12S as well as a topmost surface of the dielectric material liner 26L. It is further noted that the dielectric cap 30 is wider than an entirety of the buried power rail 28S.

Figure 9A:
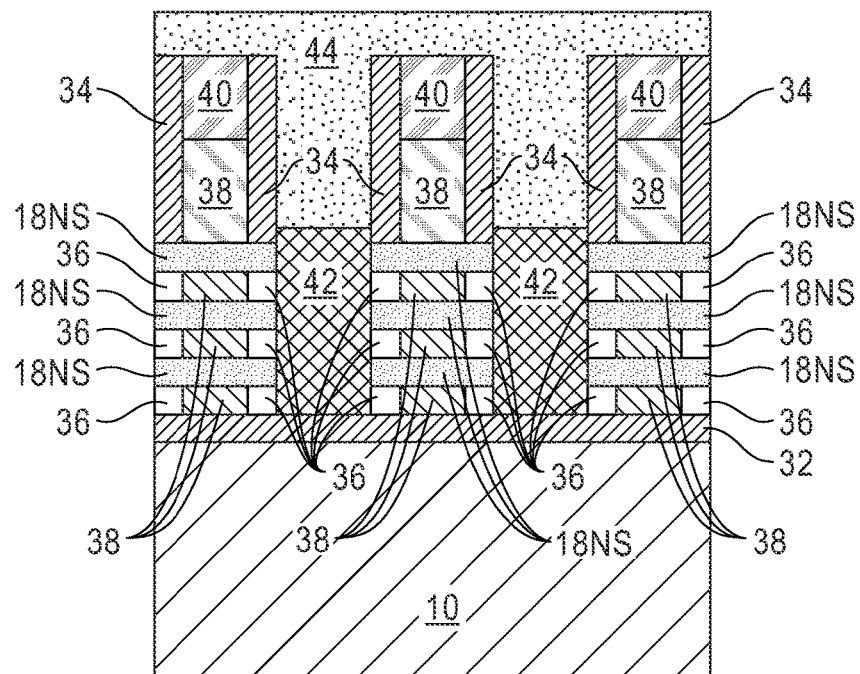
FIG. 9A is a cross sectional view of the exemplary semiconductor device of FIG. 8A after further device processing including forming a nanosheet stack of alternating nanosheets of sacrificial semiconductor material and semiconductor channel material from the material stack, recessing each sacrificial semiconductor material nanosheet, forming an inner spacer in a gap created by the recessing of each sacrificial semiconductor nanosheet, forming source/drain regions, forming a lower portion of an interlayer dielectric material layer, removing each recessed sacrificial semiconductor nanosheet to suspend each semiconductor channel material nanosheet, forming a functional gate structure around each suspended semiconductor channel material nanosheet, and forming an upper portion of the interlayer dielectric material layer.
Figure 9B:
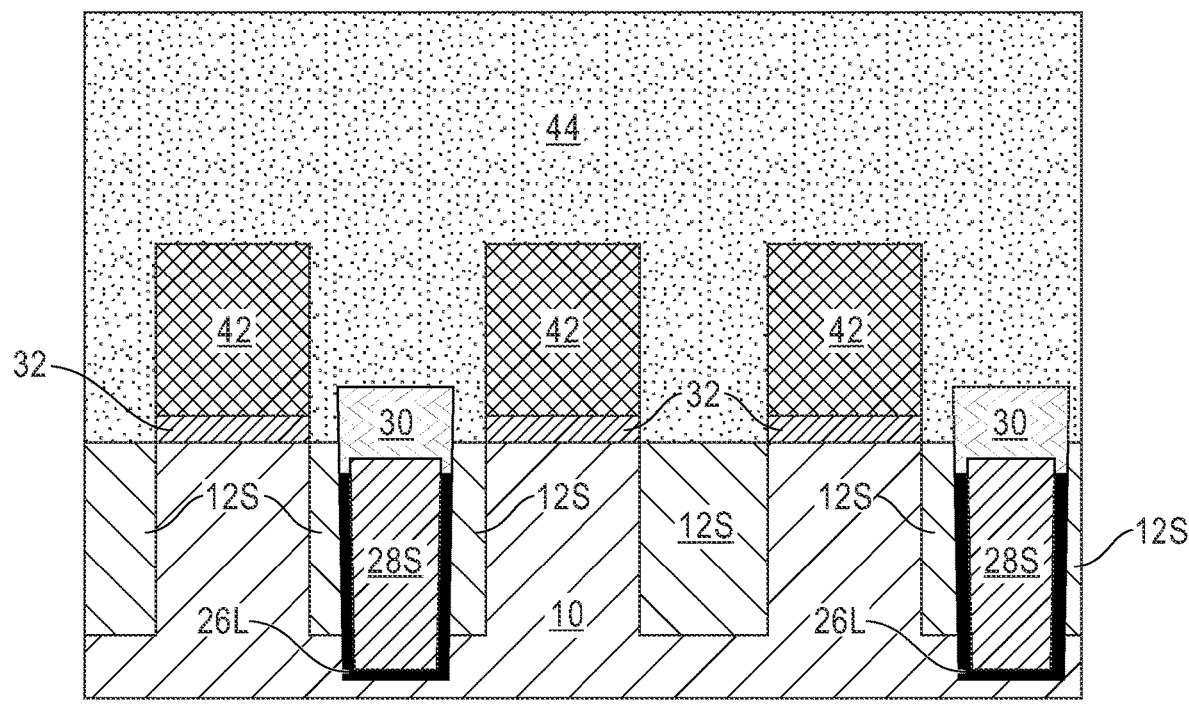
FIG. 9B is a cross sectional view of the exemplary semiconductor device of FIG. 8B after further device processing including forming a nanosheet stack of alternating nanosheets of sacrificial semiconductor material and semiconductor channel material from the material stack, recessing each sacrificial semiconductor material nanosheet, forming an inner spacer in a gap created by the recessing of each sacrificial semiconductor nanosheet, forming source/drain regions, forming a lower portion of an interlayer dielectric material layer, removing each recessed sacrificial semiconductor nanosheet to suspend each semiconductor channel material nanosheet, forming a functional gate structure around each suspended semiconductor channel material nanosheet, and forming an upper portion of the interlayer dielectric material layer.

Referring now to FIGS. 9A and 9B, there are shown the exemplary semiconductor device of FIGS. 8A and 8B, respectively, after further device processing including forming a nanosheet stack of alternating nanosheets of sacrificial semiconductor material (the sacrificial semiconductor material nanosheets are not shown since they are subsequently removed) and semiconductor channel material 18NS from the material stack, MS, recessing each sacrificial semiconductor material nanosheet (also not shown since the same are subsequently removed), forming an inner spacer 36 in a gap created by the recessing of each sacrificial semiconductor nanosheet, forming source/drain regions, forming a lower portion of an interlayer dielectric material layer 44, removing each recessed sacrificial semiconductor nanosheet to suspend each semiconductor channel material nanosheet 18NS, forming a functional gate structure 38 around each suspended semiconductor channel material nanosheet 18NS, and forming an upper portion of the interlayer dielectric material layer 44. It is noted that in FIG. 9B, there is shown an additional portion of the structure shown in FIG. 8B to emphasize additional advantages of the present application. The structure shown in FIG. 9B includes an additional buried power rail 28S located laterally adjacent to the sole buried power rail structure 28S shown in FIG. 8B.

The formation of the nanosheet stack of alternating nanosheets of sacrificial semiconductor material (not shown) and semiconductor channel material 18NS from the material stack, MS, includes forming at least one sacrificial gate structure (not shown) on, and straddling over, the material stack, MS. The at least one sacrificial gate structure includes an optional sacrificial gate dielectric material, a sacrificial gate material, and a hard mask cap. The sacrificial gate dielectric material can be composed of a dielectric material such as, for example, silicon dioxide. The sacrificial gate material can include, but is not limited to, polysilicon, amorphous silicon, amorphous silicon germanium, tungsten, titanium, tantalum, aluminum, nickel, ruthenium, palladium, platinum, or alloys of such metals. The hard mask cap can be composed of a hard mask material such as, for example, silicon dioxide, silicon nitride, silicon oxynitride or any multilayered combination thereof. The at least one sacrificial gate structure can be formed by depositing the various material layers that provide the sacrificial gate structure and then patterning these various deposited material layers by lithography and etching.

After forming the at least one sacrificial gate structure, the optional placeholder material layer 14 is selectively removed forming a void at bottom of material stack (MS). After that, a conformal dielectric spacer 34 is then formed by deposition of a dielectric spacer material, followed by a spacer etch. The dielectric spacer material that provides dielectric spacer 34 can include silicon dioxide or silicon nitride. The dielectric spacer 34 will also fill the void at bottom of the material stack (MS) forming a bottom dielectric isolation layer 32.

After forming the one sacrificial gate structure, dielectric spacer 34 and optional bottom dielectric isolation layer 32, the material stack, MS, is patterned utilizing the sacrificial gate structure and the dielectric spacer 34 as an etch mask. The patterning includes an etching process which removes physically exposed portions of the material stack, MS, not protected by the etch mask, while maintaining a portion of the material stack, MS, beneath the etch mask. The maintained portion of the material stack that is located beneath the etch mask is the nanosheet stack of alternating nanosheets of sacrificial semiconductor material (not shown) and semiconductor channel material 18NS. Each sacrificial semiconductor nanosheet has a same thickness as each layer of sacrificial semiconductor material 16, and a width that is reduced as compared to the width of each layer of sacrificial semiconductor material 16. Each semiconductor channel material nanosheet 18NS has a same thickness as each layer of semiconductor channel material 18, and a width that is reduced as compared to the width of each layer of semiconductor channel material 18. The etch stops of the on the bottom dielectric isolation layer 12, if optional placeholder material layer 14 is present, or on a surface of the semiconductor substrate 10, if the optional placeholder material layer 14 is not present.

After defining the nanosheet stack of alternating nanosheets of sacrificial semiconductor material (not shown) and semiconductor channel material 18NS, end portions of the each sacrificial semiconductor material nanosheet are recessed to form a gap (not show). The recessing includes a lateral etching process. An inner spacer 36 is then formed in the gap created by the recessing of each sacrificial semiconductor nanosheet. The forming of the inner spacers 36 includes conformal deposition of another dielectric spacer material and followed by an isotropic etching. The another dielectric spacer material can be compositionally the same as, or compositionally, different from the dielectric spacer material that provides dielectric spacer 34.

After inner spacer 36 formation, source/drain regions 42 are formed. As used herein, a "source/drain" region can be a source region or a drain region depending on subsequent wiring and application of voltages during operation of the FET. The source/drain regions 42 have a sidewall that is in directly physically contact with the outermost sidewalls of each nanosheet of semiconductor channel material 18NS. The source/drain regions 42 comprise a semiconductor material and a dopant. The semiconductor material that provides each source/drain region 42 can include one of the semiconductor materials mentioned above for the semiconductor substrate 10. The semiconductor material that provides the source/drain regions 42 can be compositionally the same, or compositionally different from each nanosheet of semiconductor channel material 18NS. The semiconductor material that provides the source/drain regions 42 is however compositionally different from each recessed sacrificial semiconductor material nanosheet.

The dopant that is present in each source/drain region 42 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 42 can have a dopant concentration of from $4 \times 10^{20}$ atoms/cm$^3$ to $3 \times 10^{21}$ atoms/cm$^3$. In one example, each bottom source/drain region 46 is composed of phosphorus doped silicon.

Each source/drain region 42 can be formed by an epitaxial growth in which the dopants are present during the epitaxial growth process. The source/drain regions 42 grow laterally outward from each of the nanosheets of semiconductor channel material 18NS. A recess etch can be optionally employed so as to reduce the height of each of the source/drain regions 42.

After source/drain region 42 formation, a bottom portion of interlayer dielectric (ILD) material layer 44 is formed; the bottom portion of the ILD material layer 44 is formed atop the source/drain regions 42 and laterally adjacent to each sacrificial gate structure. The bottom portion of the ILD material layer 44 has a topmost surface that is coplanar with a topmost surface of the sacrificial gate structure after performing a CMP process. The bottom portion of the ILD material layer 44 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the bottom portion of ILD material layer 44 can include a multilayered structure that includes at least two different dielectric materials stacked one atop the other such as, for example, silicon nitride and silicon dioxide. The bottom portion of ILD material layer 44 can be formed by a deposition process such as, for example, CVD, PECVD, or spin-on coating. A planarization process can be performed after the deposition of the dielectric material that provides the bottom portion of the ILD material layer 44; this planarization process physically exposes a topmost surface of each sacrificial gate structure.

After forming the bottom portion of the ILD material layer 44, each sacrificial gate structure is removed to provide access to the sacrificial semiconductor material nanosheets. The sacrificial semiconductor material nanosheet are removed to provide a gate cavity above and below the now suspended semiconductor channel material nanosheets 18NS. The removal of each the sacrificial semiconductor material nanosheet can include an etching process that is selective in removing the sacrificial semiconductor material relative to the semiconductor channel material.

The gate cavity is then filled with a functional gate structure 38. The functional gate structure 38 includes at least a gate dielectric material layer and a gate electrode; both of which are not individually shown in the drawings of the present application. The functional gate structure 38 wraps arounds each semiconductor channel material nanosheet 18NS with the vertical nanosheet stack. As is known, the gate dielectric material layer of the functional gate structure 38 is in direct contact with physically exposed portions of each semiconductor channel material nanosheet 18NS, and the gate electrode is located on the gate dielectric material layer. In some embodiments, the functional gate structure 38 includes a work function metal (WFM) layer located between the gate dielectric material layer and the gate electrode. In some embodiments, a gate cap 40 is located above a recessed functional gate structure 38. In other embodiments, gate cap 40 is omitted.

The functional gate structure 38 includes forming a continuous layer of gate dielectric material and a gate electrode material inside and outside the gate cavity. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of the gate cavity.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaC$_X$), titanium carbide (TiC), titanium aluminum carbide, tungsten silicide (WSi$_2$), tungsten nitride (WN), ruthenium oxide (RuO$_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM.

The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof.

In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity.

The remaining continuous layer of the gate dielectric material that is present inside the gate cavity can be referred to as a gate dielectric material layer, the remaining optional layer of WFM that is present inside the gate cavity can be referred to a WFM layer, and remaining gate electrode material that is present inside the gate cavity provides a gate electrode.

When present gate cap 40 can be composed of a hard mask material such as, for example, silicon dioxide or silicon nitride. The gate cap 40 can be formed by a deposition process, followed by a planarization process.

The upper portion of the ILD material layer 44 is then formed atop the functional gate structure 38 (including the gate cap 40 if present) and the bottom portion of the ILD material layer. 44. The upper and bottom portion of the ILD material layer 44 are typically, but not necessarily, always composed of a same dielectric material.

Figure 10A:
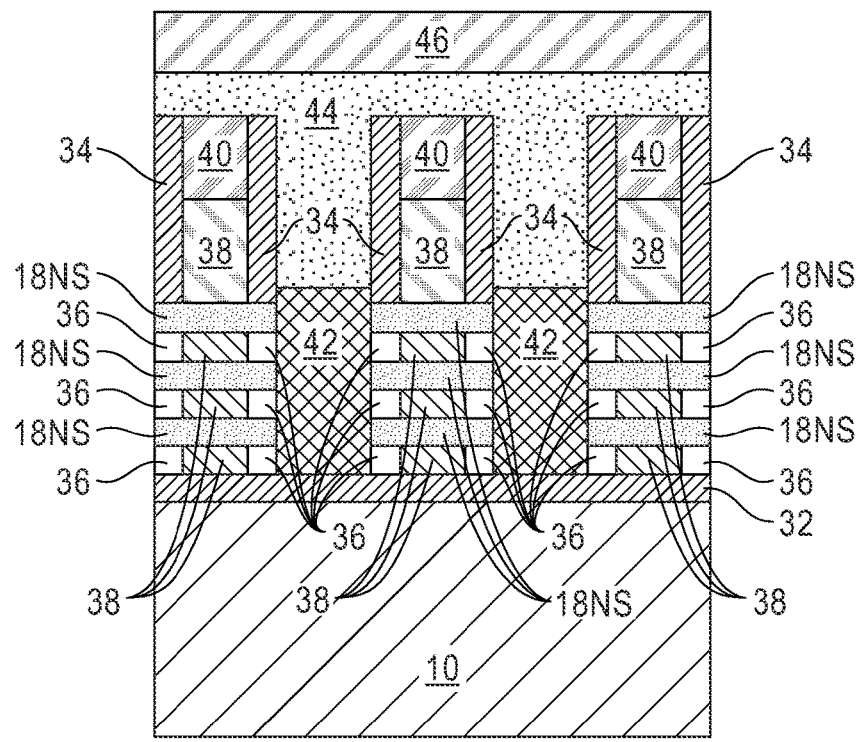
FIG. 10A is a cross sectional view of the exemplary semiconductor device of FIG. 9A after forming a via power rail contact opening that extends entirely through the interlayer dielectric material layer and physically exposes the dielectric cap that is present on the buried power rail.
Figure 10B:
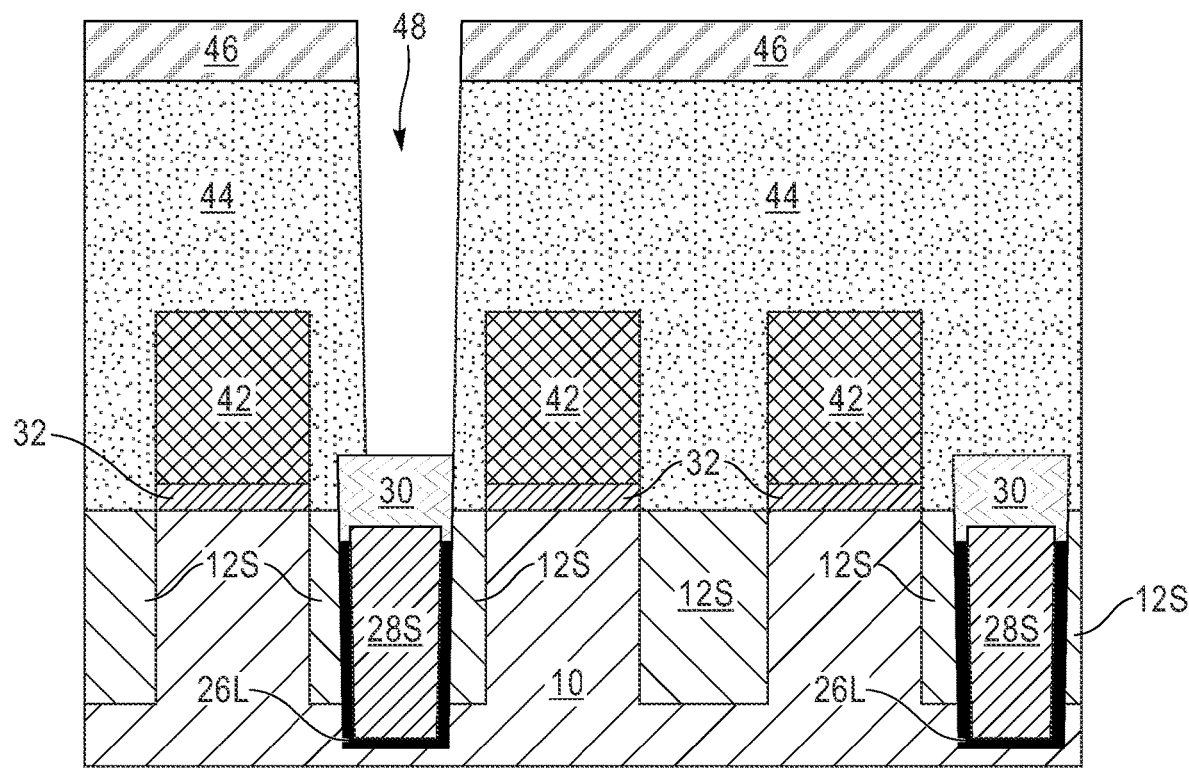
FIG. 10B is a cross sectional view of the exemplary semiconductor device of FIG. 9B after forming a via power rail contact opening that extends entirely through the interlayer dielectric material layer and physically exposes the dielectric cap that is present on the buried power rail.

Referring now to FIGS. 10A and 10B, there are shown the exemplary semiconductor device of FIGS. 9A and 9B, respectively, after forming a via to buried power rail (VBPR) contact opening 48 that extends entirely through the interlayer dielectric material layer 44 and physically exposes the dielectric cap 30 that is present on the buried power rail 28S. The formation of the VBPR contact opening 48 includes forming another patterned mask 46 on the topmost surface of the ILD material layer 44 and etching the physically exposed portion of the ILD material layer 44 that is not protected by the patterned mask 46. Patterned mask 46 can include any conventional masking material including OPL as mentioned above, and the patterned mask 46 can be formed utilizing processes techniques well known to those skilled in the art. The VBPR contact opening 48 physically exposes the dielectric cap 30 that is present on the buried power rail 28S. Note that not all dielectric cap-buried power rail structures 30/28 are processed to include a VBPR contact opening 48 that physically exposed the dielectric cap 30. Patterned mask 46 can be removed after forming the power rail contact opening 48 utilizing any material removal process.

Figure 11A:
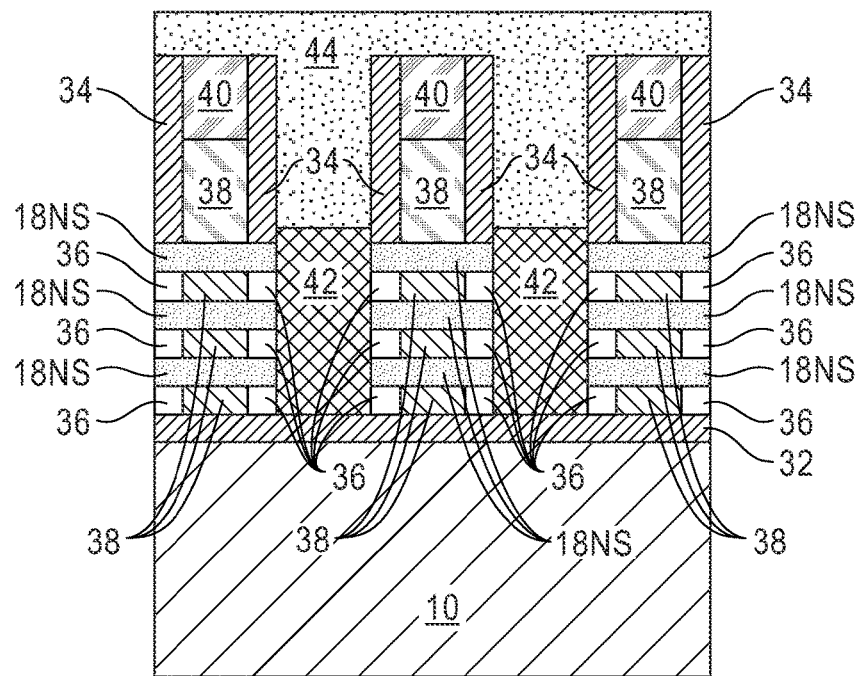
FIG. 11A is a cross sectional view of the exemplary semiconductor device of FIG. 10A after removing the physically exposed dielectric cap that is present on the buried power rail.
Figure 11B:
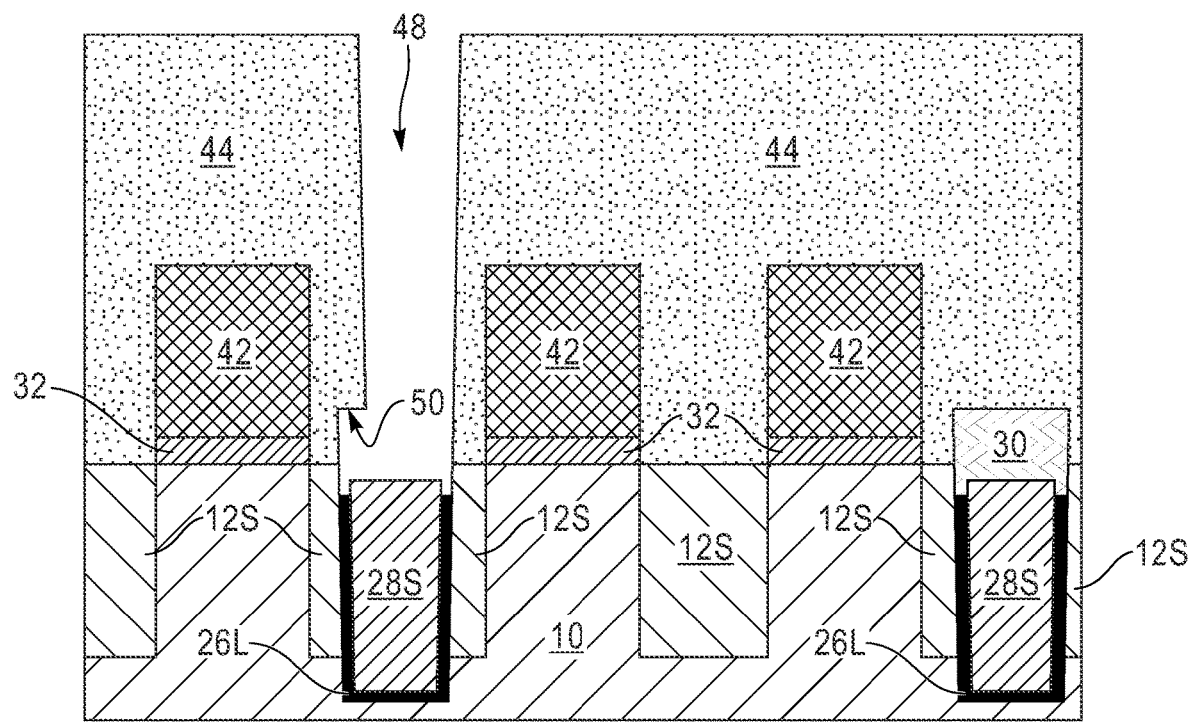
FIG. 11B is a cross sectional view of the exemplary semiconductor device of FIG. 11B after removing the physically exposed dielectric cap that is present on the buried power rail.

Referring now to FIGS. 11A and 11B, there are shown the exemplary semiconductor device of FIGS. 10A and 10B, respectively, after removing the physically exposed dielectric cap 30 that is present on the buried power rail 28S. The removal of the physically exposed dielectric cap 30 includes an etching process that is selective in removing the dielectric material that provides the dielectric cap 30. After dielectric cap 30 removal, the buried power rail 28S is physically exposed. Note that the removal of the dielectric cap 30 forms an undercut region 50 beneath a portion of the ILD material layer 44. It is noted that the removal of the dielectric cap 30 does not remove any portion of the ILD material layer 44 or any portion of the dielectric material liner 26L.

Figure 12A:
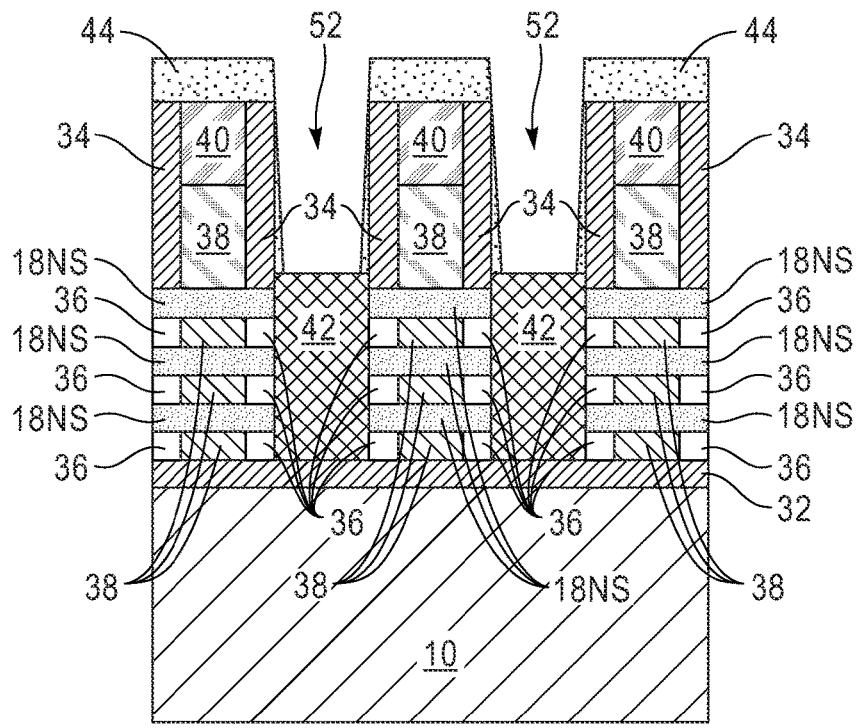
FIG. 12A is cross sectional view of the exemplary semiconductor device of FIG. 11A after forming source/drain contact openings in the interlayer dielectric material layer.
Figure 12B:
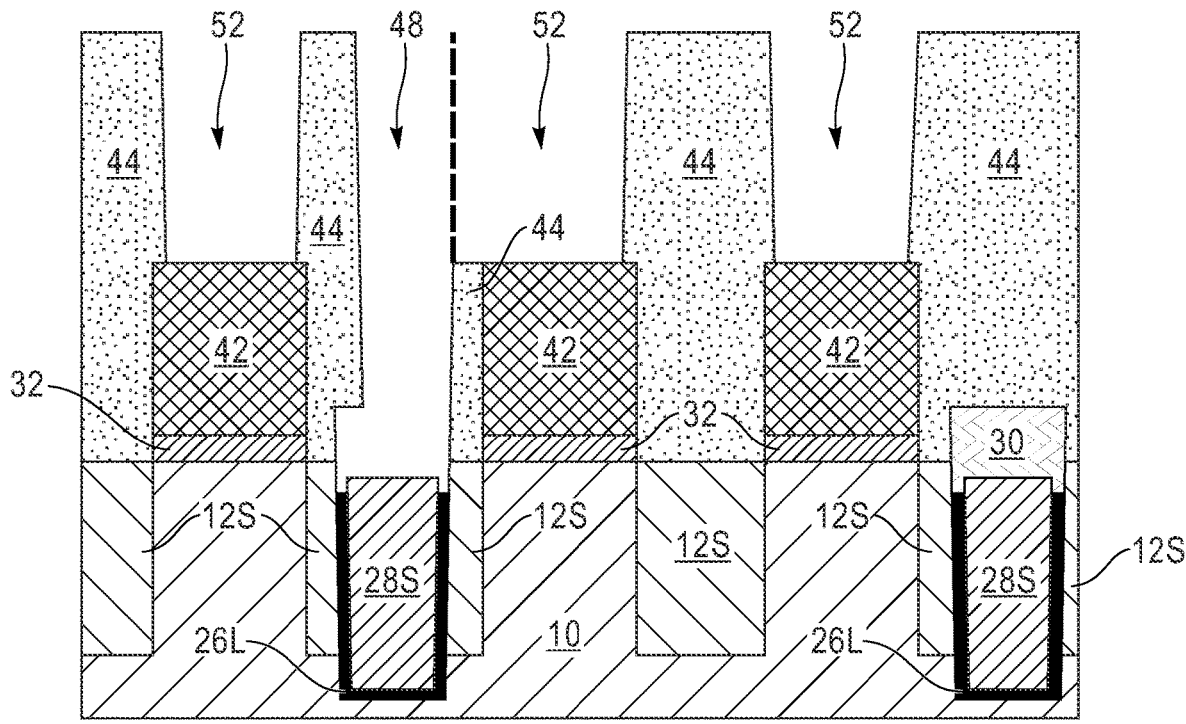
FIG. 12B is cross sectional view of the exemplary semiconductor device of FIG. 11B after forming source/drain contact openings in the interlayer dielectric material layer.

Referring now to FIGS. 12A and 12B, there are shown the exemplary semiconductor device of FIGS. 11A and 11B, respectively, after forming source/drain contact openings 52 in the interlayer dielectric material layer 44. Source/drain contact opening 52 are formed by forming a yet other patterned mask on the structure and then etching physically exposed portions of the ILD material layer 44 that are not protected with this yet other patterned mask. In some embodiments and as is shown in FIG. 12B, a source/drain contact opening 52 can merge with the VBPR contact opening 48. In other embodiments, the source/drain opening 52 and the via buried power rail contact opening 48 can be spaced apart from each other by a portion of the ILD material layer 44. The vertical dotted line shown in FIG. 12B illustrates a hypothetical boundary between these two merged openings. As is shown, each source/drain contact openings 52 physically exposes a surface of an underlying source/drain region 42.

Figure 13A:
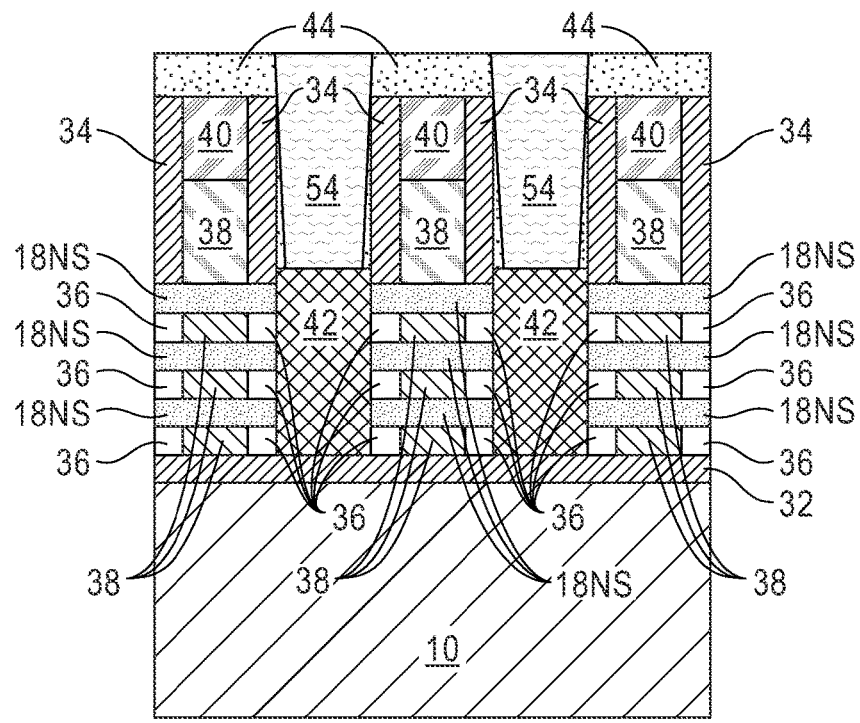
FIG. 13A is cross sectional view of the exemplary semiconductor device of FIG. 12A after forming source/drain contact structures in each source/drain contact opening, and a via to buried power rail (VBPR) contact structure in the via buried power rail opening.
Figure 13B:
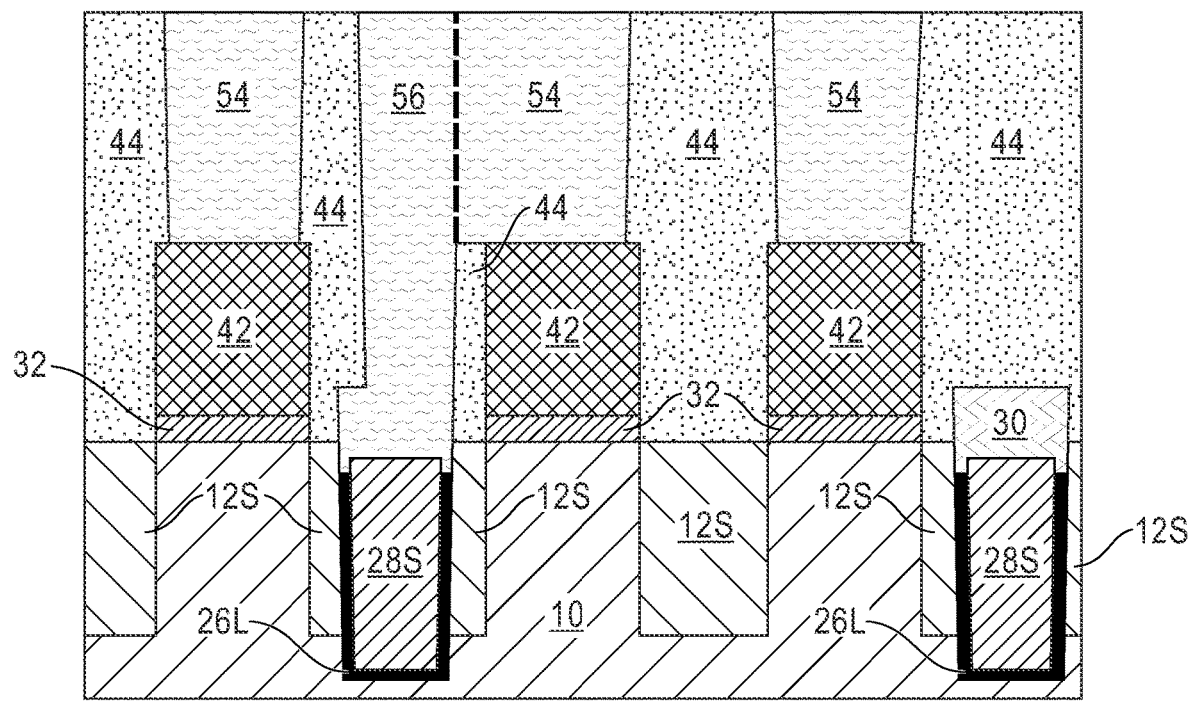
FIG. 13B is cross sectional view of the exemplary semiconductor device of FIG. 12B after forming source/drain contact structures in each source/drain contact opening, and a via to buried power rail (VBPR) contact structure in the via buried power rail opening.

Referring now to FIGS. 13A and 13B, there are shown the exemplary semiconductor device of FIGS. 12A and 12B, respectively, after forming source/drain contact structures 54 in each source/drain contact opening 52, and a VBPR contact structure 56 in the VBPR opening 48. The source/drain contact structures 54 and the VBPR contact structure 56 both include at least a contact conductor material. In some embodiments, the source/drain contact structures 54 and the VBPR contact structure 56 can also include a contact liner (not shown).

In some embodiments, and when a merged via buried power rail contact opening 48 and source/drain contact opening 52 are formed, the contact structure that is formed in the merged contact openings 48, 52 is of unitary construction and serves as both a contact structure to the buried power rail 28S and the source/drain region 42. In other embodiments in which no merged VBPR contact opening 48 and source/drain contact opening 52 is present separate contact structures are formed. In FIG. 13B, the vertical dotted line shows a hypothetical boundary that can exist between the VBPR contact structure 56 and the source/drain contact structure 54.

In one or more embodiments in which a contact liner is present, the contact liner (not shown) can include a silicide liner, such as Ti, Ni, NiPt, etc, and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, RFPVD, CVD or ALD. The contact liner that is formed can have a thickness ranging from 1 nm to 8 nm, although lesser and greater thicknesses can also be employed.

The contact conductor material can include a metal such as, for example, W, Cu, Al, Co, Ru, Mo, Os, Jr, Rh or an alloy thereof. The contact conductor layer can be formed by any suitable deposition method such as, for example, ALD, CVD, PVD or plating. A planarization process can be used to remove the contact conductor material and the contact liner (when provided) that are located outside the source/drain contact openings. The remaining contact conductor material and if present, the contact liner provide source/drain contact structure 54 and VBPR 56.

As is shown in FIG. 13B, the VBPR contact structure 56 includes a bottom portion that is located in, and beneath, the undercut region 50. As is also shown in FIG. 13B, the VBPR contact structure 56 contacts an upper portion of the sidewall of the buried power rail 28S and a topmost surface of the buried power rail 28S. The VBPR contact structure 56 also contacts a topmost surface of dielectric material liner 26L.

Figure 14A:
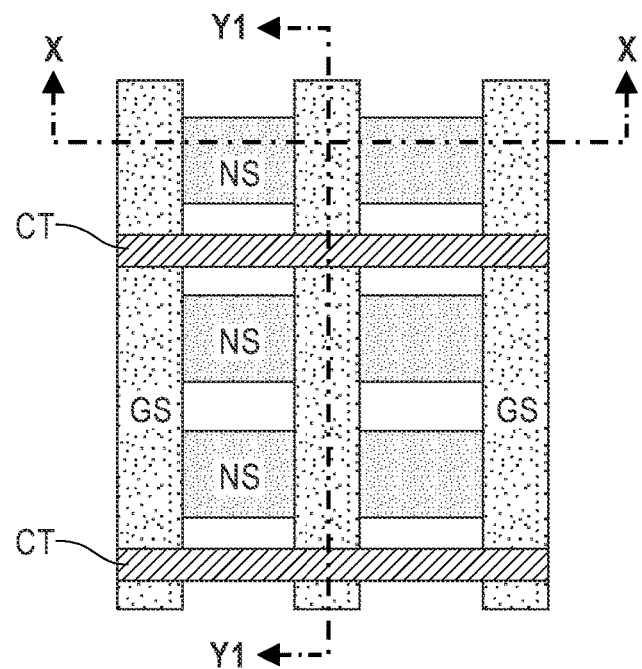
FIG. 14A is a top down view of an exemplary semiconductor device layout similar to the device layout shown in FIG. 1, but including gate cut, CT, regions.

Referring now to FIG. 14A is a top down view of an exemplary semiconductor device layout similar to the device layout shown in FIG. 1, but including gate cut, CT, regions. FIG. 14A also a cut Y-Y which is through one of the functional gate structures.

Figure 14B:
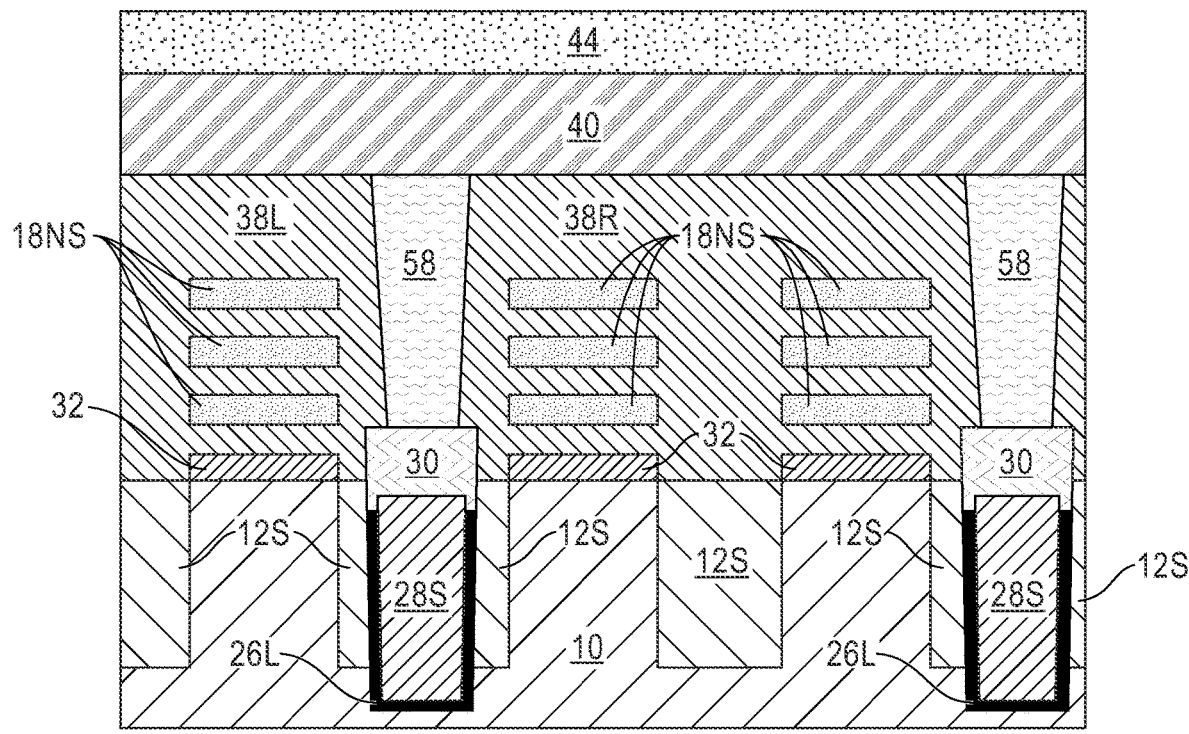
FIG. 14B is a cross sectional view of an exemplary semiconductor device along cut Y1-Y1 shown in FIG. 14A.

Referring now to FIG. 14B, there is illustrated an exemplary semiconductor device along cut Y1-Y1 shown in FIG. 14A. The exemplary structure shown in FIG. 14B can be formed utilizing the basic process steps of the present application. The exemplary structure shown in FIG. 14B is formed after cutting the functional gate structure 38 (to separate the gate structure to provide a first functional gate structure 38L and a second functional gate structure 38R) by lithography and etching, and then filling the cut trench that is formed between the cut functional gate structure 38 with a cut gate dielectric material (e.g., silicon dioxide) to form a gate cut dielectric structure 38. The gate cut dielectric structure 58 is located on a topmost surface of the dielectric cap 30, wherein the gate cut dielectric structure separates a first functional gate structure from a second functional gate structure. This process is performed after formation of the functional gate structure but prior to forming the optional gate cap 40 and the upper portion of the ILD material layer 44.

As is shown in FIG. 14B, each of the dielectric cap 30 and the gate cut dielectric structure 58 has a first side that directly contact the first functional gate structure 38L and a second side, opposite the first side, that directly contacts the second functional gate structure 38R. Moreover, and as is shown in FIG. 14B, the gate cut dielectric structure 58 has a topmost surface that is coplanar with a topmost surface of both the first functional gate structure 38L and the second functional gate structure 38R.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor device, the method comprising:
   forming a buried power rail opening that extends entirely through a shallow trench isolation layer and partially through a semiconductor substrate;
   forming a dielectric material layer and a power rail conductive material in the buried power rail opening;
   recessing the power rail conductive material to provide a buried power rail located at a bottom portion of the buried power rail opening;
   recessing the dielectric material layer to provide a dielectric material liner that is located on a lower portion of a sidewall of the buried power rail and on a bottommost surface of the buried power rail; and
   forming a dielectric cap on an upper portion of the sidewall of the buried power rail and on a topmost surface of the buried power rail.

2. The method of claim 1, wherein the buried power rail opening is formed in a non-active device region.

3. The method of claim 2, further comprising forming a source/drain region of a functional gate structure located in an active device region, wherein the active device region is located laterally adjacent to the non-active device region.

4. The method of claim 3, wherein the source/drain region of the functional gate structure is located on a buried dielectric insulator layer.

5. The method of claim 3, further comprising forming a source/drain contact structure contacting a surface of the source/drain region of the functional gate structure.

6. The method of claim 3, further comprising forming an interlayer dielectric material layer that embeds the source/drain contact structure, the source/drain region, and an upper portion of the dielectric cap.

7. The method of claim 3, wherein the functional gate structure is wrapped around a plurality of vertically stacked and spaced apart semiconductor channel material nano sheets.

8. The method of claim 2, further comprising
   forming a functional gate structure in an active device region, wherein the active device region is located laterally adjacent to the non-active device region;

forming an interlayer dielectric material layer; and replacing the dielectric cap with a via to buried power rail (VBPR) contact structure, wherein the VBPR contact structure is formed in contact with the buried power rail.

9. The method of claim 8, wherein the replacing the dielectric cap comprises forming an VBPR contact opening in the interlayer dielectric material layer that physically exposes the dielectric cap, and performing an etching process that is selective in removing the dielectric cap.

10. The method of claim 9, wherein the etching process forms an undercut region beneath a portion of the interlayer dielectric material layer.

11. The method of claim 9, wherein the VBPR contact structure includes a bottom portion that is located in, and beneath, the undercut region.

12. The method of claim 11, wherein the VBPR contact structure contacts an upper portion of the sidewall of the buried power rail and the topmost surface of the buried power rail.

13. The method of claim 9, further comprising forming source/drain contact openings in the interlayer dielectric material, wherein at least one of the source/drain contact openings merges with the VBPR contact opening forming a merged contact opening, wherein the VBPR contact structure is formed in the merged contact opening.

14. The method of claim 1, wherein the dielectric cap has a topmost surface that is higher than a topmost surface of the semiconductor substrate, or higher than a topmost surface of the shallow trench isolation structure.

15. The method of claim 1, wherein the dielectric liner has an upper portion contained in the shallow trench isolation structure and a lower portion contained in the semiconductor substrate.

16. The method of claim 1, further comprising forming an interlayer dielectric material layer, wherein the interlayer dielectric material layer embeds an upper portion of the dielectric cap.

17. The method of claim 1, wherein the dielectric cap is wider than an entirety of the buried power rail.

18. The method of claim 1, wherein the dielectric cap is composed of a compositionally different dielectric material than a dielectric material that provides the dielectric material liner.

19. The method of claim 1, further comprising forming a gate cut dielectric structure on a surface of the dielectric cap.

* * * * *